United States Patent [19]

Iwamatsu et al.

[11] Patent Number: 5,656,537
[45] Date of Patent: Aug. 12, 1997

[54] METHOD OF MANUFACTURING A SEMICONDUCTOR DEVICE HAVING SOI STRUCTURE

[75] Inventors: Toshiaki Iwamatsu; Yasuo Inoue, both of Hyogo, Japan

[73] Assignee: Mitsubishi Denki Kabushiki Kaisha, Tokyo, Japan

[21] Appl. No.: 463,253

[22] Filed: Jun. 5, 1995

[30] Foreign Application Priority Data

Nov. 28, 1994 [JP] Japan ................................ 6-292697

[51] Int. Cl.$^6$ ............................................. H01L 21/76
[52] U.S. Cl. ......................... 438/402; 438/404; 438/154; 438/165
[58] Field of Search ................................ 430/62, 69, 70; 148/DIG. 85, DIG. 86, DIG. 47

[56] References Cited

U.S. PATENT DOCUMENTS 4,753,896  6/1988  Matloubian .

FOREIGN PATENT DOCUMENTS

| 53-68990 | 6/1978 | Japan | ...................... 437/62 |
| 54-146581 | 11/1979 | Japan . | |
| 61-251166 | 11/1986 | Japan . | |
| 63-192223 | 8/1988 | Japan . | |
| 63-237573 | 10/1988 | Japan . | |
| 63-261728 | 10/1988 | Japan . | |
| 145156 | 2/1989 | Japan . | |
| 1-117345 | 5/1989 | Japan . | |
| 1-282839 | 11/1989 | Japan . | |
| 4-127433 | 4/1992 | Japan . | |
| 4-151838 | 5/1992 | Japan . | |
| 590394 | 4/1993 | Japan . | |

OTHER PUBLICATIONS

Electronics Letters; Aug. 18, 1983, vol. 19, No. 17, pp. 684–685, "Subthreshold Currents in CMOS Transistors Made on Oxygen–Implanted Silicon."

*Primary Examiner*—George Fourson
*Attorney, Agent, or Firm*—Lowe, Price, LeBlanc & Becker

[57] ABSTRACT

A buried oxide film and an SOI layer are formed on the main surface of a substrate. A nitride film patterned in predetermined configuration is formed on the surface of the SOI layer. The first selective oxidation treatment is applied to the SOI layer with the nitride film used as a mask. At this stage, the isolating oxide film is formed not to reach the buried oxide film. Anisotropic etching is applied to the isolating oxide film with the nitride film used as a mask. A sidewall insulating layer of oxidation-resistant material is formed on the sidewall of the nitride film. With the sidewall insulating layer and nitride film used as masks, the second selective oxidation treatment is applied to the SOI layer, thereby forming an isolating oxide film. Thereby, it becomes possible to prevent a parasitic MOS transistor being formed in the end of the SOI layer.

12 Claims, 24 Drawing Sheets

METHOD OF MANUFACTURING A SEMICONDUCTOR DEVICE HAVING SOI STRUCTURE

BACKGROUND OF THE INVENTION

1. Field of the Invention

This invention relates to a method of manufacturing a semiconductor device having an SOI (Semiconductor On Insulator) structure.

2. Description of Related Arts

A conventional method of manufacturing a semiconductor device having an SOI structure will first be described using FIGS. 27 through 51. FIG. 27 is a sectional view showing a conventional semiconductor device having an SOI structure. FIGS. 28 through 51 are sectional views showing the first through 24th steps in a process for manufacturing a conventional semiconductor device having SOI structure shown in FIG. 27.

First, the structure of a conventional semiconductor device having an SOI structure will be described using FIG. 27.

A buried oxide film 2 is formed on the main surface of a silicon substrate. Formed on this buried oxide film 2 is a semiconductor layer (hereinafter referred to simply as "SOI layer") 3. Formed on the SOI layer 3 are an nMOS transistor 14 and a pMOS transistor 15. The nMOS transistor 14 has an n⁻ region 5a and an n⁺ region 5b formed in the SOI layer 3, a gate oxide film 20, and a gate electrode 8. The pMOS transistor 15 has a p⁻ region 6a and a p⁺ region 6b formed in the SOI layer 3, a gate oxide film 20, and a gate electrode 8.

Titanium silicide layers 10 are formed on the surface of the n⁺ region 5b, the surface of the p⁺ region 6b, and the upper surface of the gate electrode 8. Further, the sidewall of the gate electrode 8 is formed with a sidewall insulating layer 16.

The nMOS transistor 14 and pMOS transistor 15 are isolated by an isolating oxide film 4 selectively formed on the SOI layer 3. The lateral end of the SOI layer 3 having the nMOS transistor 14 formed therein is formed with a high concentration impurity region 13 for element isolation. In this case, a high concentration p-type impurity is contained in this high concentration impurity region 13.

An interlayer dielectric 9 is formed to cover the SOI layer 3. This interlayer dielectric 9 is provided with a contact hole 11 at a predetermined position. And formed in this contact hole 11 and on the interlayer dielectric 9 is a metal electrode 12.

Next, using FIGS. 28 through 51, a description will be given of a method of manufacturing a conventional semiconductor device of SOI structure described above.

Referring to FIG. 28, a burred oxide film 2 and an SOI layer 3 are formed on the main surface of a silicon substrate 1 by a conventional method. A surface of SOI layer 3 is oxidized in the condition of 950° C. wet ambience to form an oxide film 20 having a thickness of about 300 Å. Formed on this oxide film 20 by using the CVD (Chemical Vapor deposition) method is a nitride film 21 having a thickness of about 500 Å.

Subsequently, a resist is applied to the nitride film 21 and patterned in a predetermined configuration. Thereby, as shown in FIG. 29, a resist pattern 22a is formed. Further, a resist pattern 22b is formed to cover the region where the pMOS transistor 15 is to be formed. And, as shown in FIG. 30, using the resist patterns 22b and 22a as masks, boron (B) ions are implanted into the SOI layer 3. The conditions are $3 \times 10^{13}/cm^2$, 20 KeV.

Next, referring to 31, subsequent to the removal of resist patterns 22a and 22b, a heat treatment is applied to the SOI layer 3. Thereby, a p-type high concentration impurity region 13 is formed.

Next, referring to FIG. 32, a selective oxidation treatment is applied to the SOI layer 3 by using the nitride film 21 as a mask. The conditions for this selective oxidation treatment are 950° C., 60 minutes in a wet ambience. In this manner, the isolating oxide film 4 is formed by a single selective oxidation treatment. Thereafter, as shown in FIG. 33, the nitride film 21 is removed as by hot phosphoric acid.

Next, referring to FIG. 34, a resist pattern 22c is formed to cover the region where the pMOS transistor 15 is be formed. Using this resist pattern 22c as a mask, boron (B) ions are implanted into the SOI layer 3. Thereby, channel doping for the nMOS transistor 14 is effected.

Next, referring to FIG. 35, subsequent to the removal of resist pattern 22c, a resist pattern 22d is formed to cover the region where the nMOS transistor 14 is to be formed. Using this resist pattern 22d as a mask, boron (B) ions are implanted into the SOI layer 3. Thereby, channel doping for the pMOS transistor 15 is effected.

Next, referring to FIG. 36, subsequent to the removal of resist pattern 22d, a polycrystalline silicon layer 8a having a thickness of about 3000 Å is formed as by the CVD method. At this time, preferably, phosphorus (P) in an amount of about $1 \times 10^{19}/cm^3$ or more is contained in this polycrystalline silicon layer 8a. A resist pattern 22e is formed on this polycrystalline silicon layer 8a. And using this resist pattern as a mask, the polycrystalline silicon layer 8a is etched. This results in forming a gate electrode 8, as shown in FIG. 37.

Next, referring to FIG. 38, a resist pattern 22f is formed to cover the region where the pMOS transistor 15 is to be formed. Using this resist pattern 22f as a mask, phosphorus (P) is implanted into the SOI layer 3. This results in forming an n⁻ region 5a.

Next, referring to FIG. 39, subsequent to the removal of resist pattern 22f, a resist pattern 22g is formed to cover the region where the nMOS transistor 14 is to be formed. Using this resist pattern 22g as a mask, boron (B) is implanted into the SOI layer 3. This results in forming a p⁻ region 6a.

Next, as shown in FIG. 40, TEOS (Tetra Ethyl Ortho Silicate) is used to form an oxide film (TEOS oxide film) 16a having a thickness of about 1500 Å. Anisotropic etching is applied to this TEOS oxide film 16a. As shown in FIG. 41, this results in forming a sidewall insulating layer 16.

Next, referring to FIG. 42, a resist pattern 22h is formed to cover the region where the pMOS transistor 15 is to be formed. Using this resist pattern 22h as a mask, arsenic (As) is implanted into the SOI layer 3. This results in forming an n⁺ region 5b.

Next, referring to FIG. 43, subsequent to the removal of said resist pattern 22h, a resist pattern 22i is formed to cover the region where the pMOS transistor 15 is to be formed. Using this resist pattern 22i as a mask, boron (B) is implanted into the SOI layer 3. This results in forming a p⁺ region 6b.

Subsequently, the resist pattern 22i is removed. Thereby, as shown in FIG. 44, the pMOS and nMOS transistors 15 and 14, respectively, are formed.

Next, referring to FIG. 45, a Ti layer 10a having a thickness of about 200 Å is formed as by sputtering. And this Ti layer 10a is subjected to lamp annealing at about 700° C. for about 30 seconds. Thereby, the Ti layer 10a and the silicon layer thereunder are allowed to react with each other. And subsequent to the removal of the unreacted Ti layer 10a, a predetermined heat treatment is applied to thereby form a titanium silicide layer 10 as shown in FIG. 46.

Next, referring to FIG. 47, an interlayer dielectric 9 comprising a TEOS oxide film is formed. And formed on this interlayer dielectric 9, as shown FIG. 48, is a resist pattern 2j in predetermined pattern configuration. Using this resist pattern 22j as a mask, etching is applied to the interlayer dielectric 9. As shown in FIG. 49, this result in forming contact holes 11.

Next, referring to FIG. 50, a metal layer 12a containing Al is formed as by sputtering. Formed on this metal layer 12a, as shown in FIG. 51, is a resist pattern 22k in predetermined pattern configuration. And using this resist pattern 22k as a mask, the metal layer 12a is patterned. This results in forming a semiconductor device shown in FIG. 27.

The pMOS and nMOS transistors 15 and 14 formed in the manner described above are isolated by the isolating oxide film 4. However, the formation of this isolating oxide film 4 by a single selective oxidation treatment as described above presents a problem, which will be described with reference to FIG. 52. FIG. 52 is an enlarged sectional view of the lateral end of the SOI layer 3 where the nMOS transistor 14 is formed in FIG. 27.

As shown in FIG. 52, in the case where the isolating oxide film 4 is formed by a single selective oxidation treatment, this leads to the formation of a thinned portion 3a of the SOI layer 3 under the isolating oxide film 4. The possession of this thinned portion 3a leads to the formation a parasitic transistor particularly at the end portion of the SOI layer 3 where the nMOS transistor 14 is formed. Thus, there has been problem that the subthreshold characteristics of MOS transistors are degraded.

The reason why the formation of the thinned portion 3a leads to the formation of a parasitic transistor in the thinned portion 3a will now be described in detail. Generally, the threshold voltage (Vth) of MOS transistors is expressed by the following formula.

$$Vth = V_{FB} + 2\phi_B + Qs/Ci \quad (1)$$

where $V_{FB}$ is the flat-band voltage; $2\phi_B$ is the surface potential, Qs is the surface charge, and Ci is the gate oxide film capacity.

The $V_{FB}$ is expressed by a value which is obtained by subtracting the fixed charge/gate oxide film capacity from the difference in work function between the gate and the channel, and Qs is proportional to the product of the channel concentration and the depletion layer width. That is, when the fixed charge increases around the oxide film, the $V_{FB}$ decreases, and when the channel concentration or the depletion layer width decreases, the surface charge Qs decreases.

With the above taken into account, a description will be given of the reason why the formation of the thinned portion 3a leads to the formation of a parasitic MOS transistor having a low threshold voltage in the thinned portion 3a.

First, the $V_{FB}$ in the formula (1) will be described. Since the thinned portion 3a has a region which is in contact with the isolating oxide film 4, there is a high probability of the orientation of the crystals being deviated from <100> by the stress produced during the formation of the isolating oxide film 4. Therefore, the boundary 24 between the thinned portion 3a and the isolating oxide film 4 is formed with a fixed charge and interface state greater than those of the gate oxide film of the MOS transistor formed on the SOI layer 3. This fixed charge causes the $V_{FB}$ to take a value lower than the $V_{FB}$ of the intrinsic MOS transistor.

Next, Qs/Ci will be described. As the isolating oxide film 4 is formed, the impurity is absorbed from the thinned portion 3a located close to the isolating oxide film 4. As a result, the concentration of the impurity contained in the thinned portion 3a lowers. As described above, since Qs is proportional to the product of the channel concentration and the depletion layer width, the decrease of the concentration of the impurity contained in the thinned portion 3a corresponding to the channel leads to the decrease of the value of Qs. Further, in the region where thickness of the SOI layer decreases, the depletion layer width may be taken to be approximate to the thickness of the SOI layer 3. Therefore, in the thinned portion 3a, the depletion layer width is very small. Thus, the value of Qs is also very small.

Because of the above, $V_{FB}$ and Qs in the formula 1 are small, so that the value of Vth can be small. That is, a transistor having the thinned portion 3a as the channel and having lower threshold voltage (Vth) is formed. This transistor is to be the parasitic transistor. The formation in the thinned portion 3a of the SOI layer 3 of this parasitic transistor whose threshold voltage (Vth) is low means that the subthreshold characteristics of the MOS transistor formed on the SOI layer 3 is degraded.

SUMMARY OF THE INVENTION

This invention has been accomplished to solve the above problems. An object of the invention is to provide a method of manufacturing a semiconductor device having an SOI structure capable of effectively preventing a parasitic transistor from being formed in the lateral end of the SOI layer.

In a method of manufacturing a semiconductor device having an SOI structure according to the present invention, first, a semiconductor layer is formed on the main surface of a substrate with an insulating layer interposed. A patterned oxidation-resistant film is formed on the semiconductor layer. In addition, by the term "oxidation-resistant film" is meant a film having resistance to oxidation. Using this oxidation-resistant film as a mask, a first selective oxidation treatment is applied to the semiconductor layer to form a first isolating oxide film having a bottom surface in the semiconductor layer. Using the oxidation-resistant film as a mask, anisotropic etching is applied to the first isolating oxide film, thereby selectively exposing the surface of the semiconductor layer and leaving a part of the first isolating oxide film under the lateral end of the oxidation-resistant film. A sidewall insulating layer is formed of oxidation-resistant material on the sidewall of the oxidation-resistant film to cover the first isolating oxide film being left under the oxidation-resistant film. A second isolating oxide film integrated with the first isolating oxide film and reaching the insulating layer is formed by applying a second selective oxidation treatment to the exposed surface of the semiconductor layer using the oxidation-resistant film and sidewall insulating layer as masks.

As described above, according to a method of manufacturing a semiconductor device having an SOI structure of the present invention, the second isolating oxide film is formed by performing the two steps of first and second selective oxidation treatments. And prior to the second selective oxidation treatment, a sidewall insulating layer of oxidation-resistant material is formed on the sidewall of the oxidation-resistant film, the sidewall insulating layer is used as a mask for the second selective oxidation treatment. Thereby, it becomes possible to suppress the growth of bird's beak of the second isolating oxide film even if a relatively excessive degree of oxidation treatment is applied to the semiconductor layer. As a result, it becomes possible to apply a relatively excessive degree of oxidation treatment to the semiconductor layer. Such excessive degree of oxidation treatment makes it possible to fully oxidize the bottom of the semiconductor layer which is close to the second isolating oxide film. Thereby, it becomes possible to effectively prevent formation of a thinned portion being extremely small in thickness and having been formed in conventional examples in the bottom of the semiconductor layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to FIGS. 1 through 26.

(First Embodiment)

Figure 1:
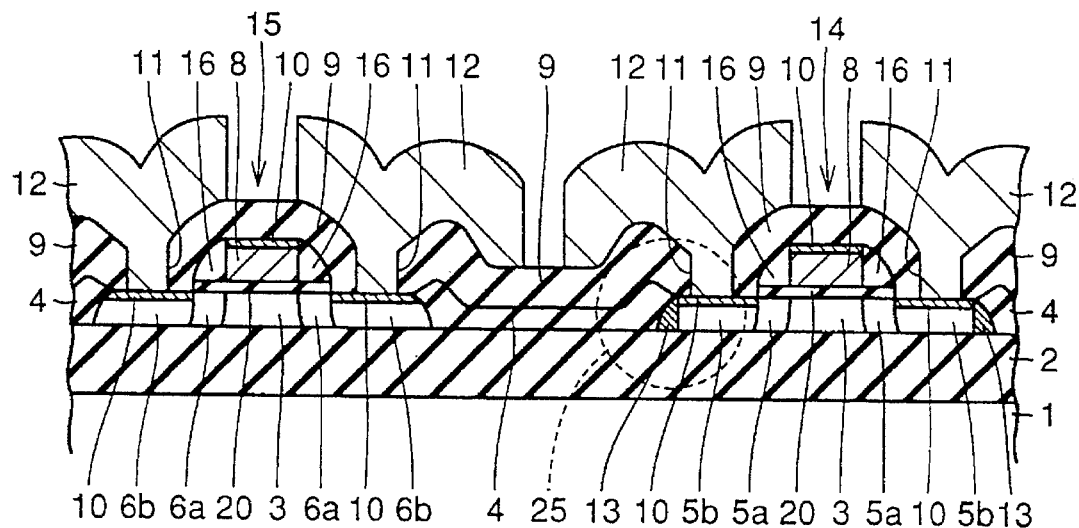
FIG. 1 is a sectional view showing a semiconductor device having an SOI structure formed through a method of manufacturing a semiconductor device according to the present invention.

First, using FIGS. 1 through 8, a first embodiment of the invention will be described. FIG. 1 is a sectional view showing a semiconductor device having an SOI structure formed through a method according to the present invention.

Figure 27:
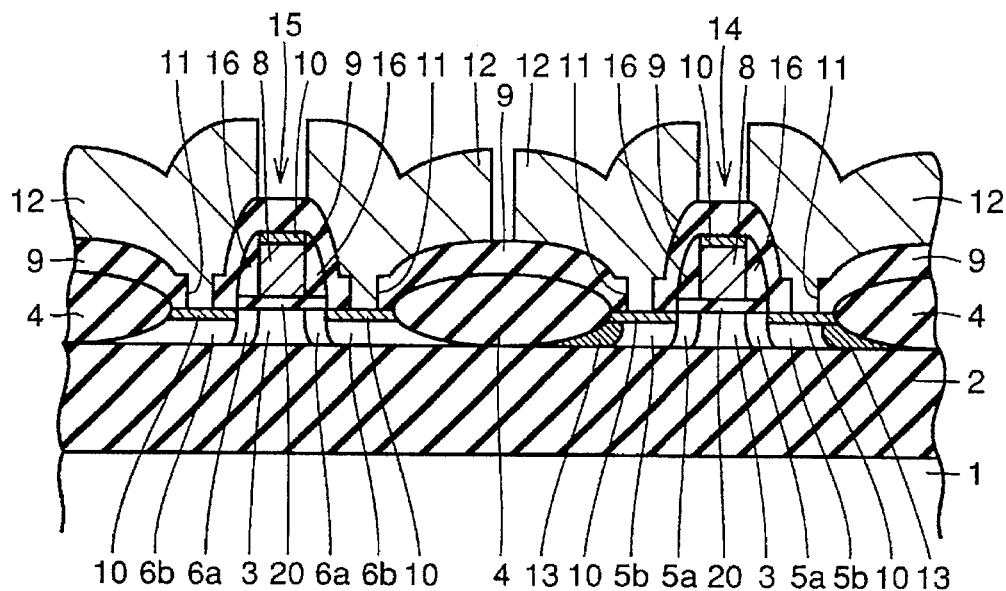
FIG. 27 is a sectional view showing an example of a conventional semiconductor device having an SOI structure.
Figure 28:
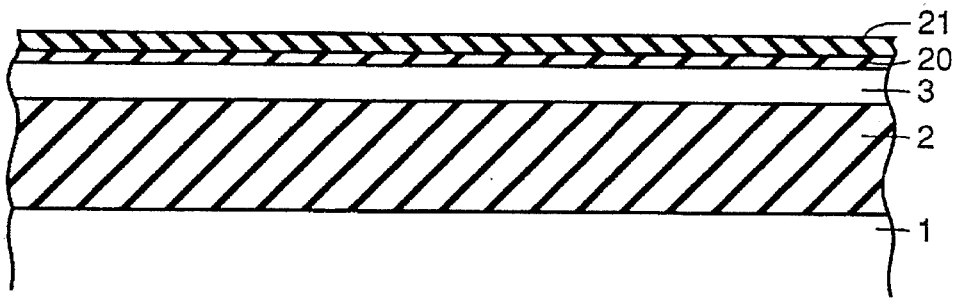
FIGS. 28 through 51 are sectional views showing the first through 24th steps in the process of manufacturing a semiconductor device having the SOI structure shown in FIG. 27.
Figure 29:
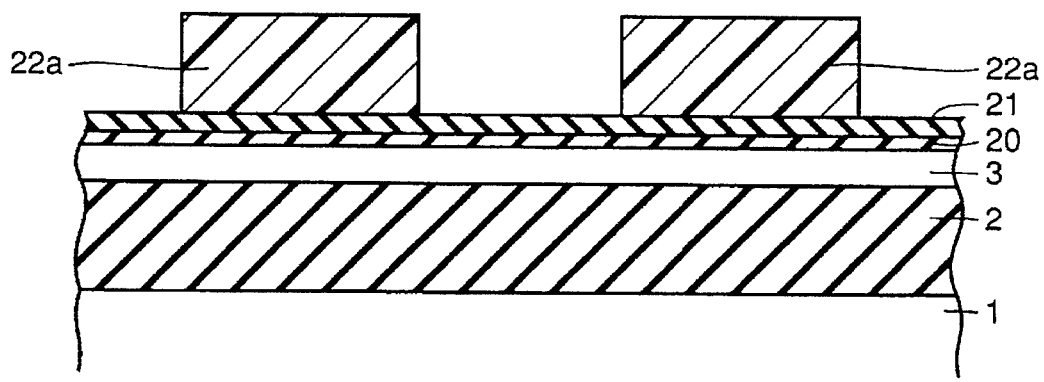
Figure 30:
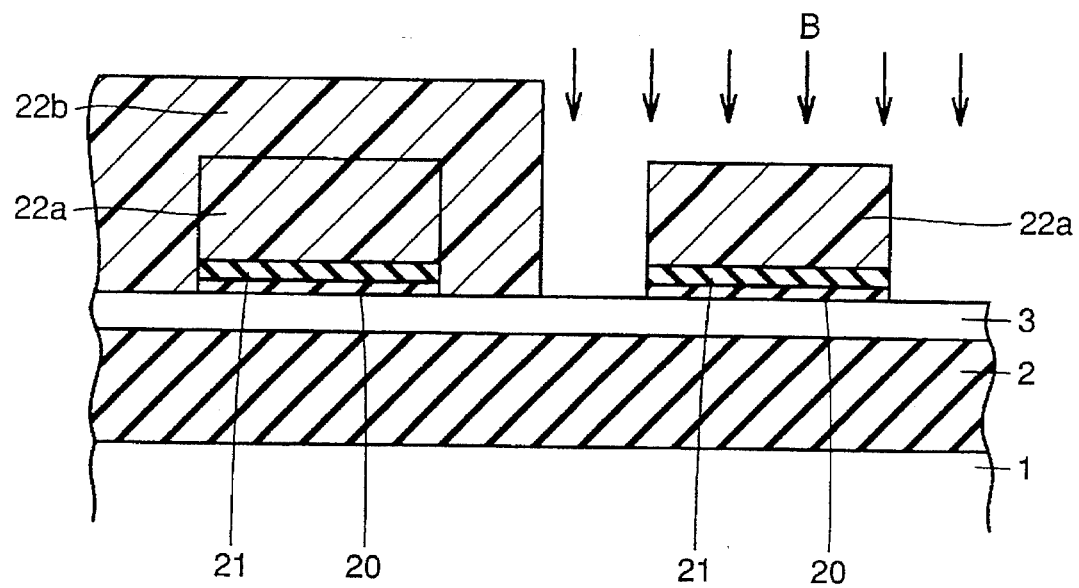
Figure 31:
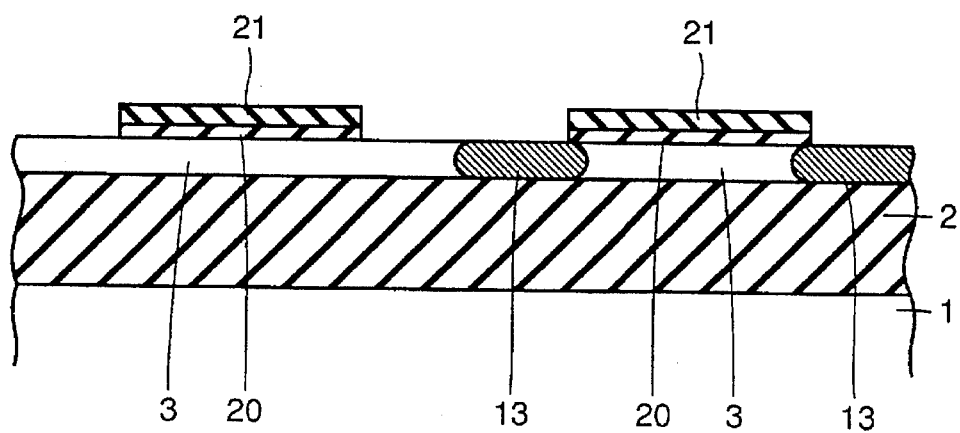
Figure 32:
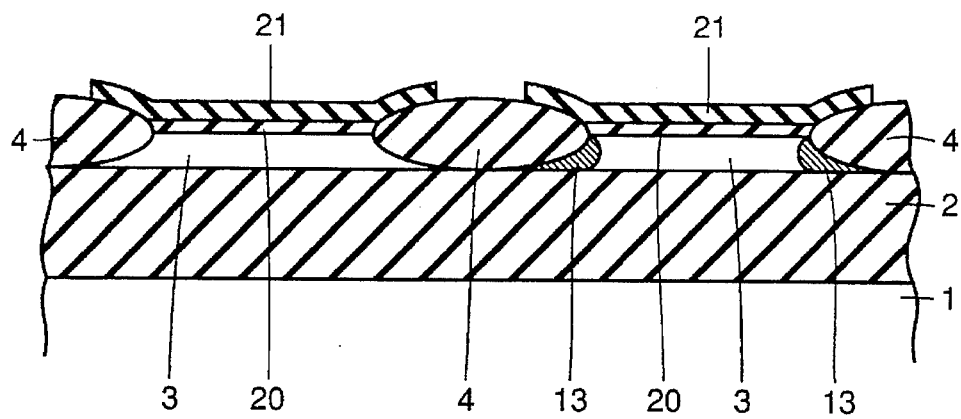
Figure 33:
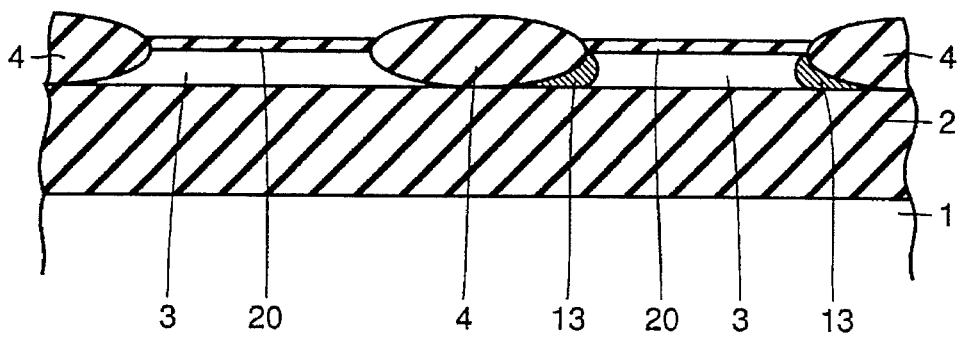
Figure 34:
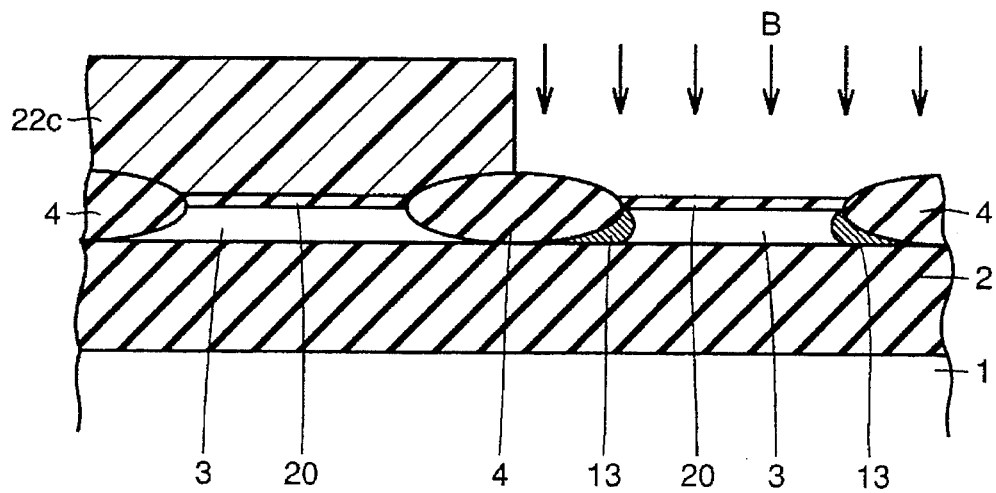
Figure 35:
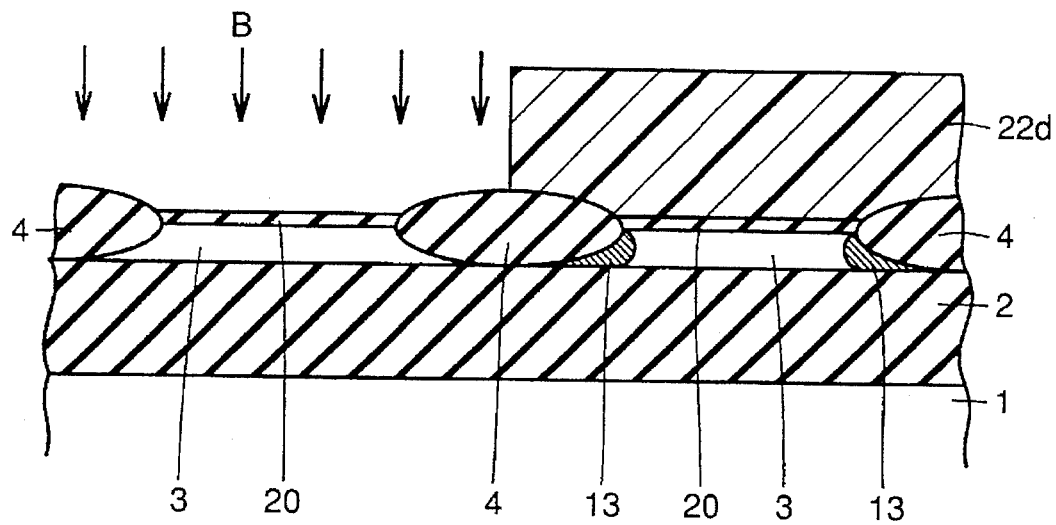
Figure 36:
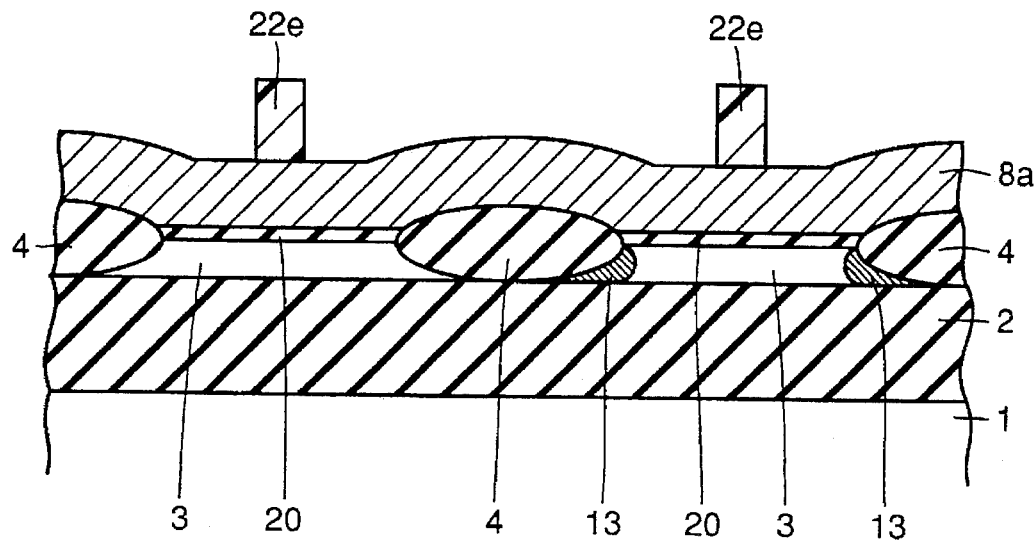
Figure 37:
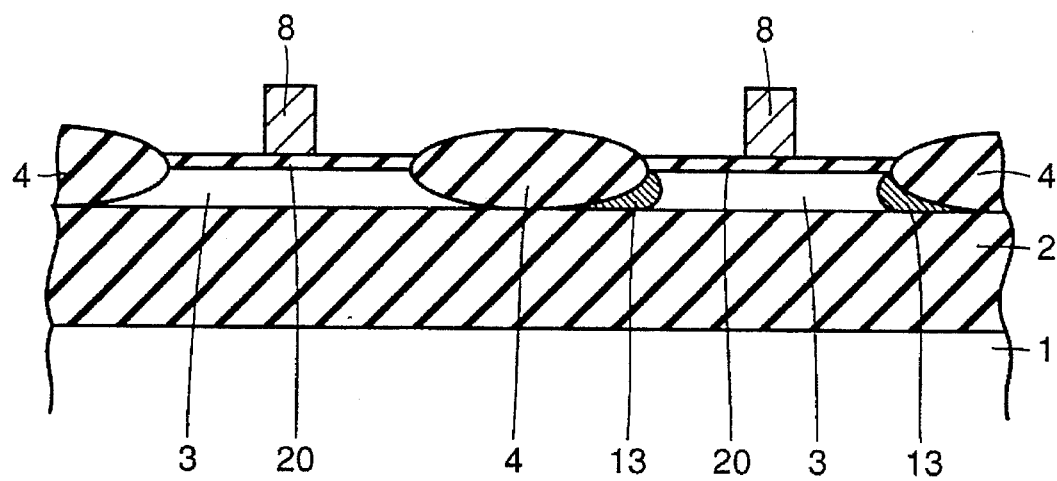
Figure 38:
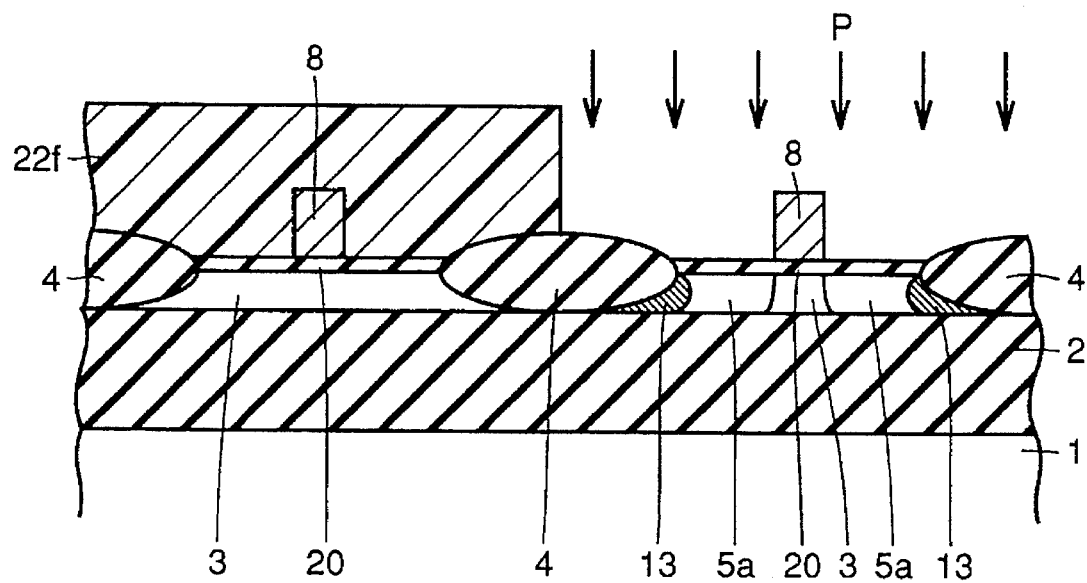
Figure 39:
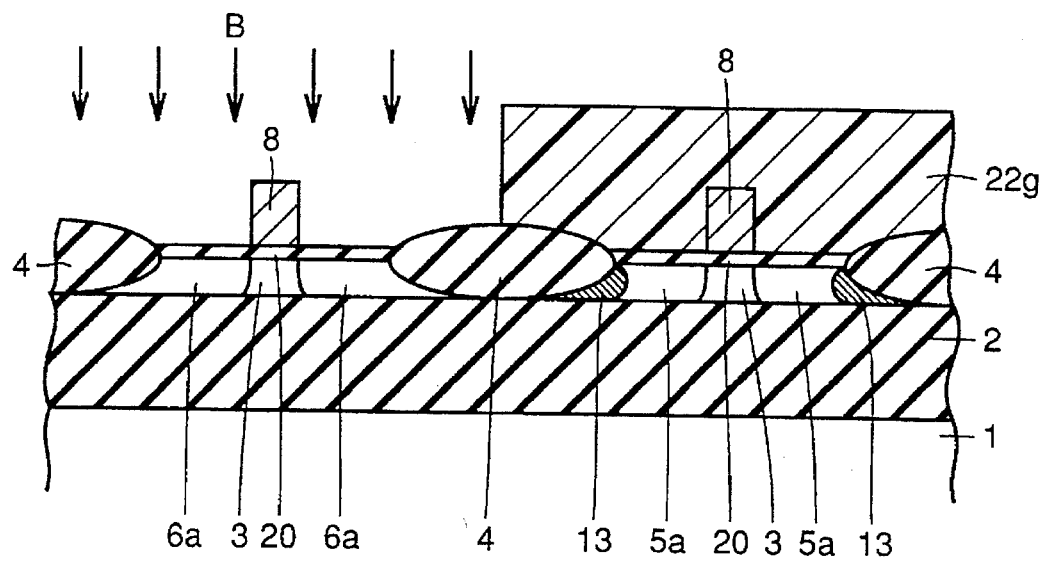
Figure 40:
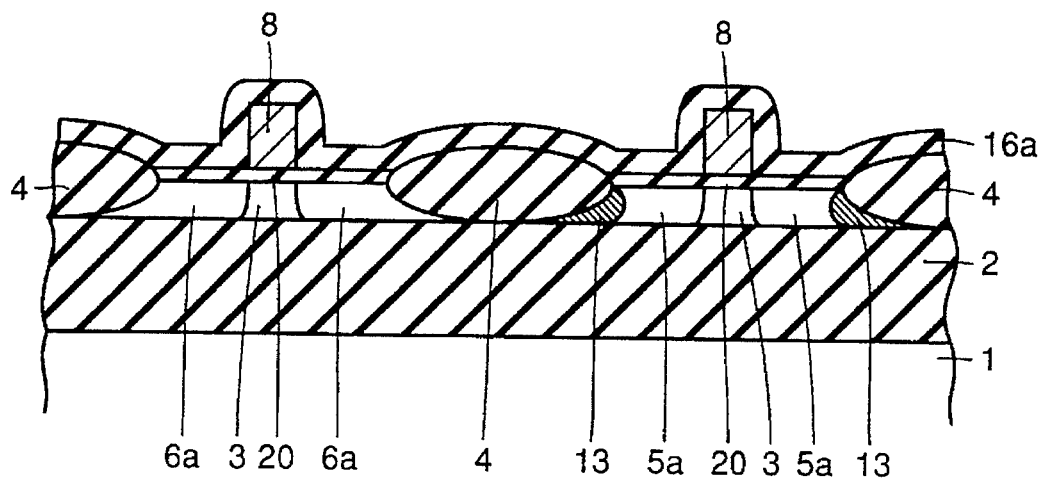
Figure 41:
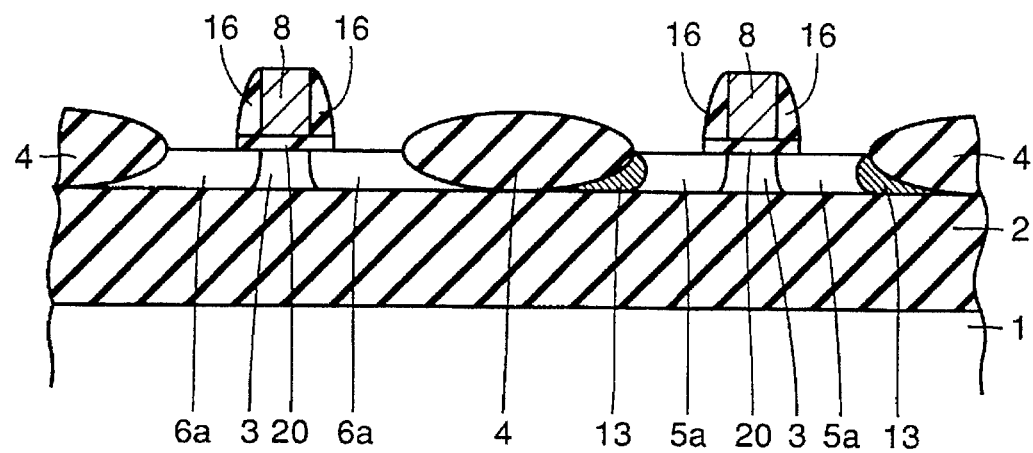
Figure 42:
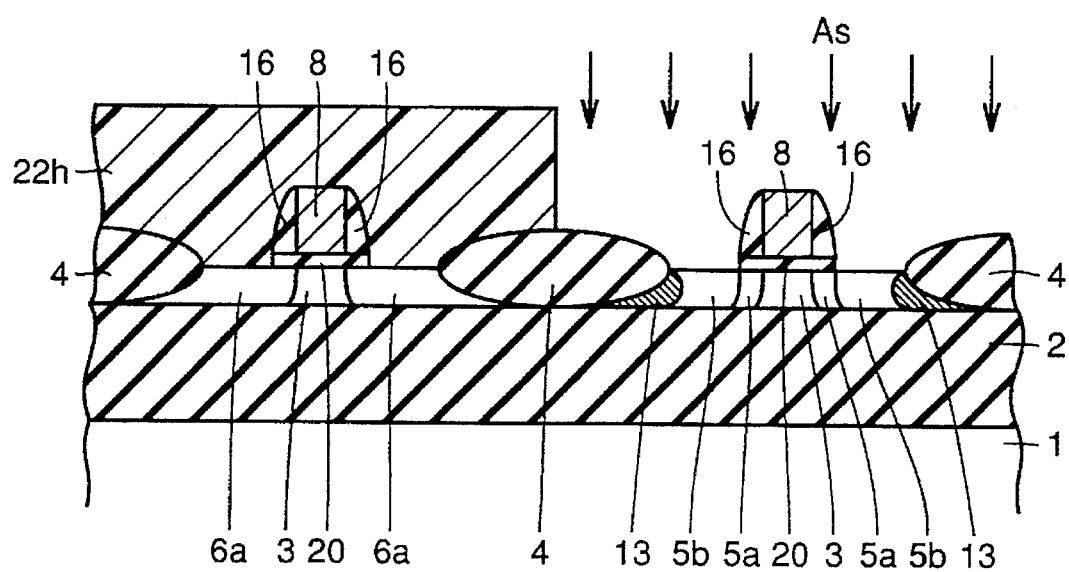
Figure 43:
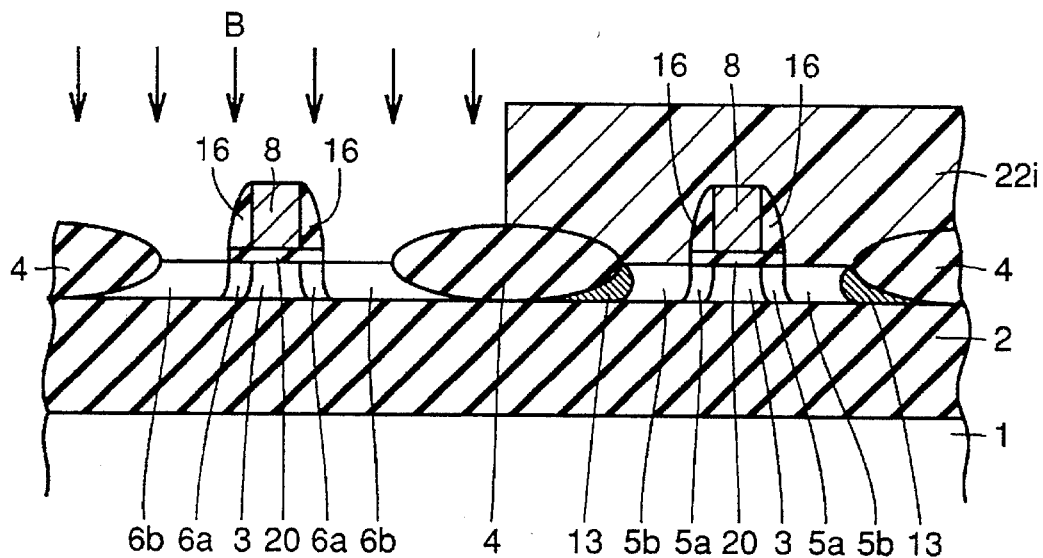
Figure 44:
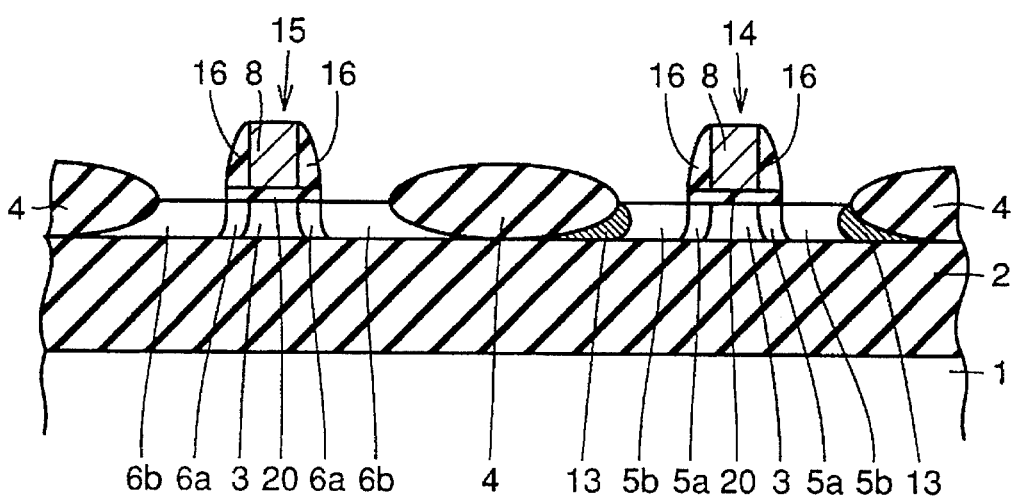
Figure 45:
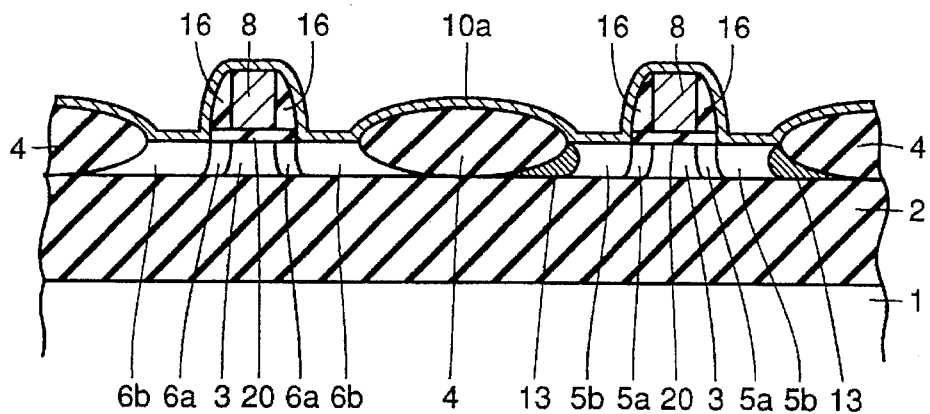
Figure 46:
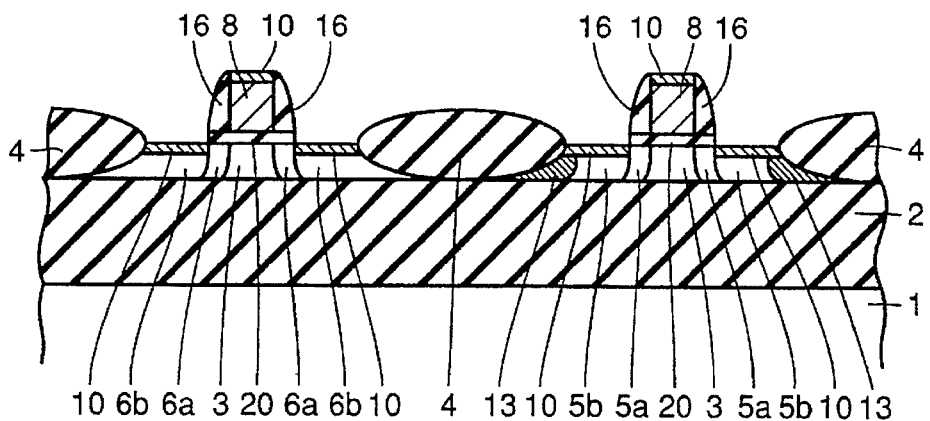
Figure 47:
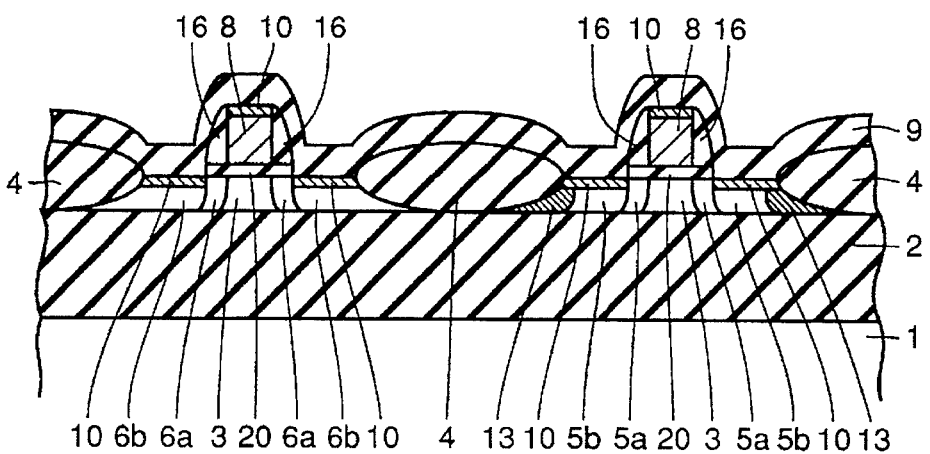
Figure 48:
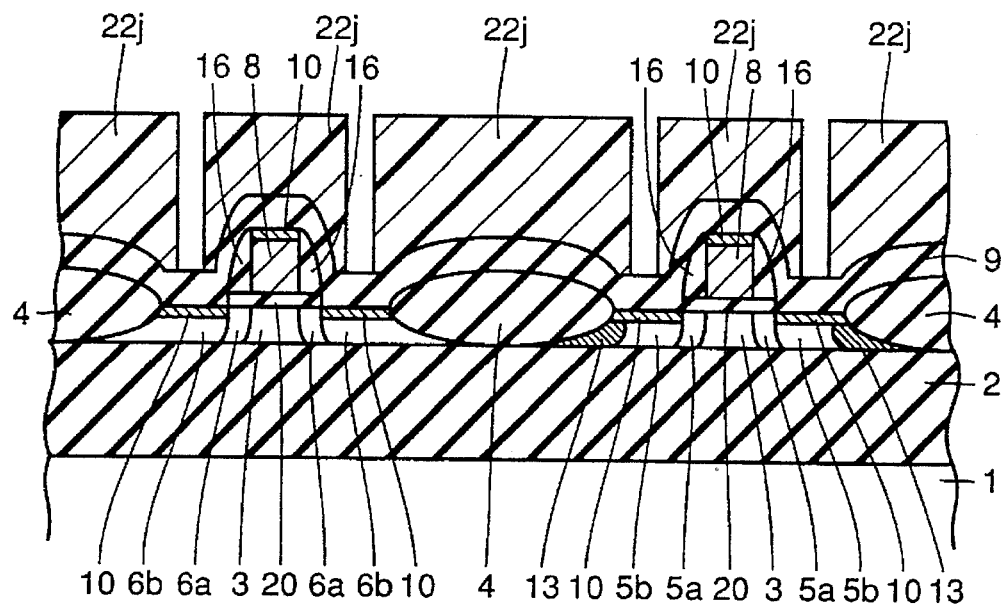
Figure 49:
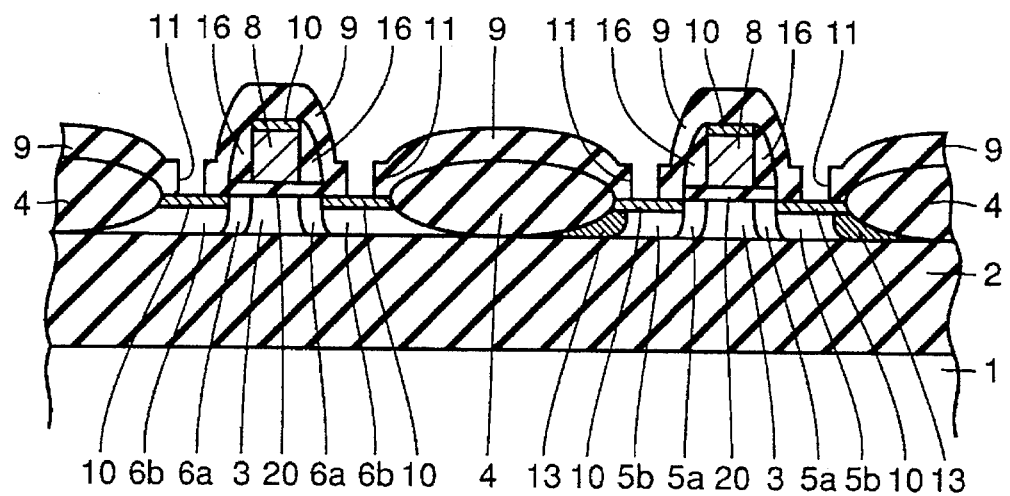
Figure 50:
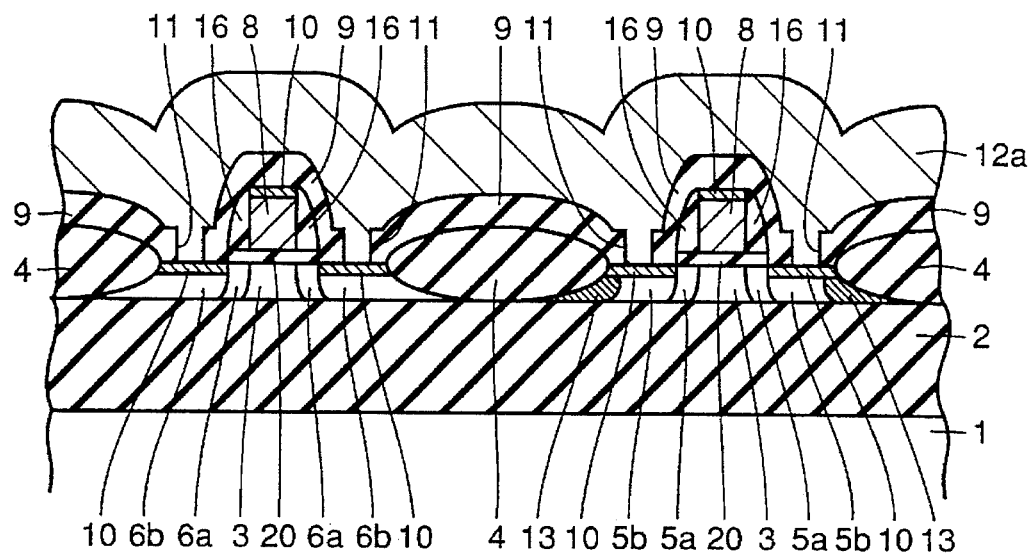
Figure 51:
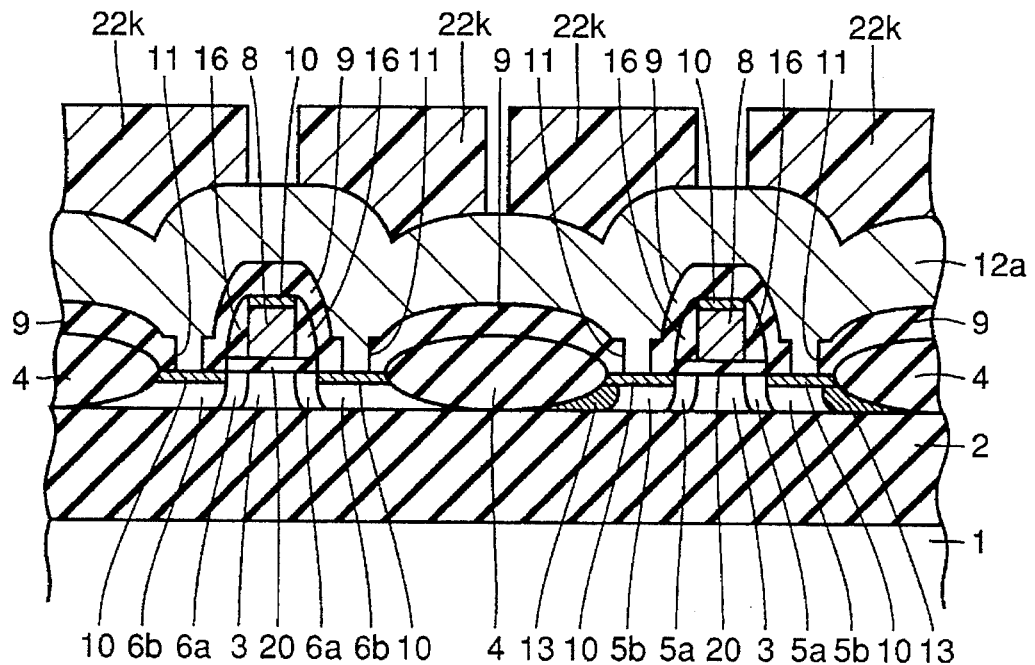
Figure 52:
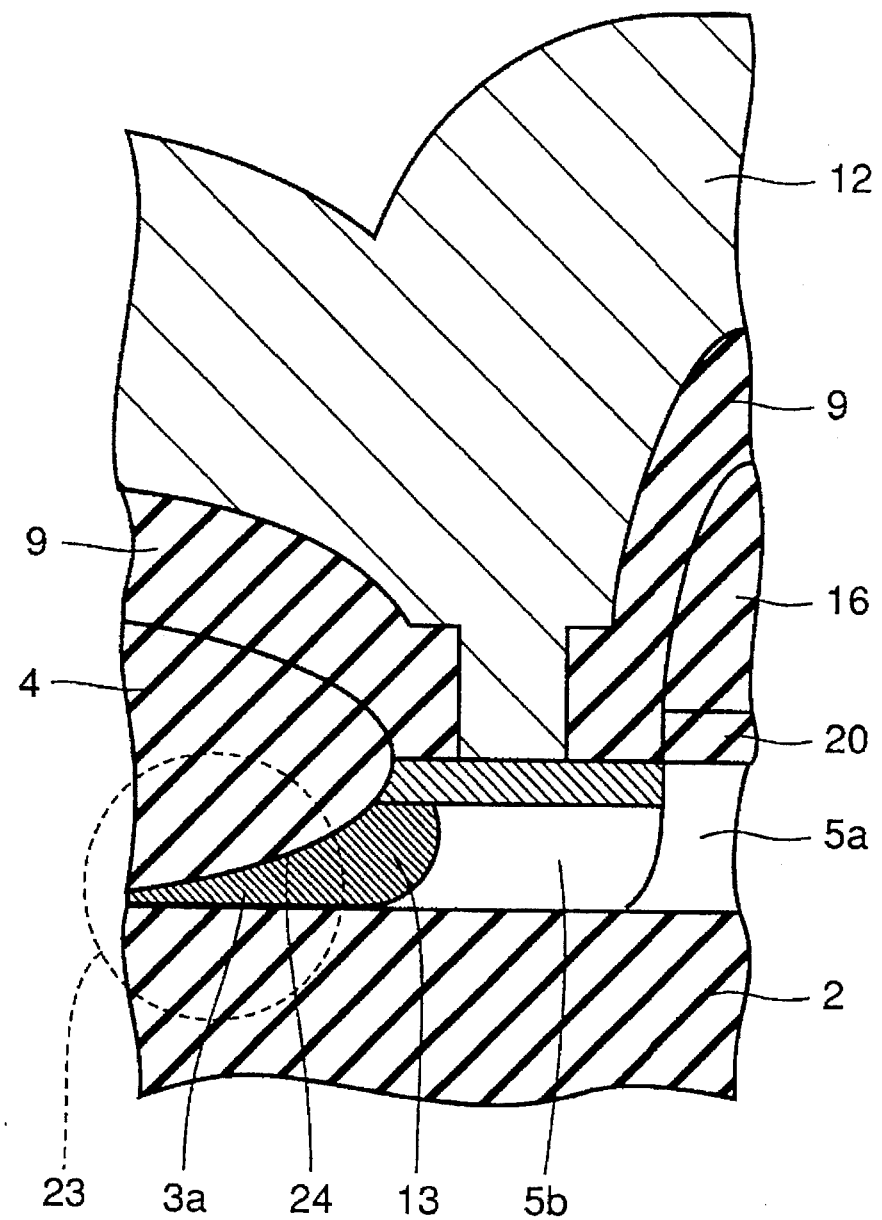
FIG. 52 is an enlarged sectional view of the lateral end of the SOI layer in the semiconductor conventional device having the SOI structure shown in FIG. 27.

Referring to FIG. 1, a thinned portion 3a having an extremely small thickness as in the prior art is not formed at the lateral end of an SOI layer (semiconductor layer) 3. Further, an isolating oxide film 4 has an upwardly convex portion at the vicinity of the lateral end of the SOI layer 3. The rest of the arrangement is substantially the same as in the conventional semiconductor device shown in FIG. 27. Therefor, a description of the rest of the arrangement will be omitted.

Figure 2:
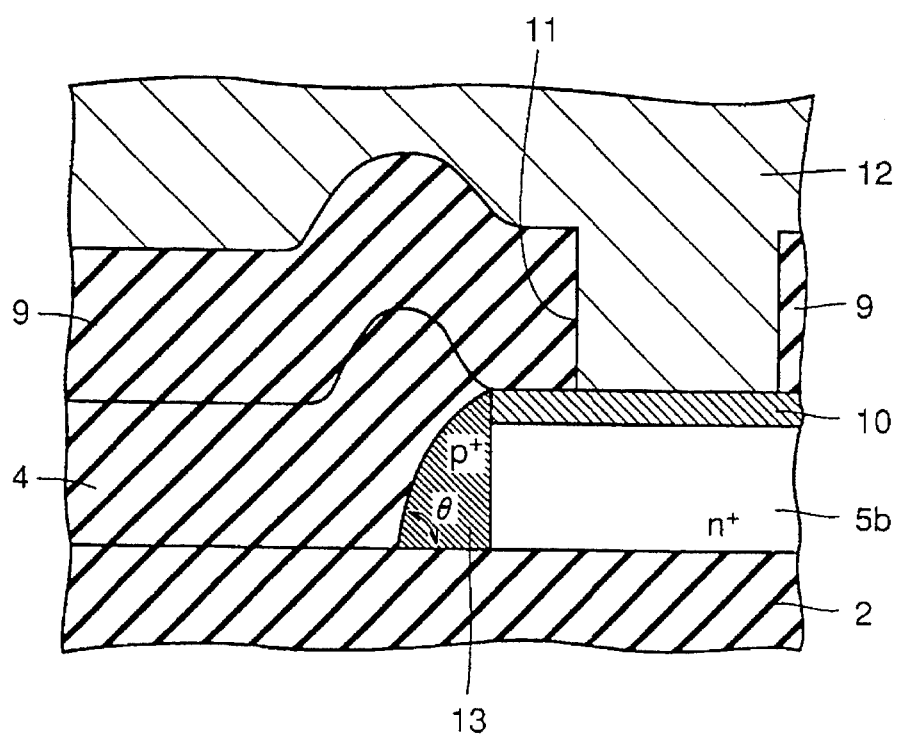
FIG. 2 is an enlarged sectional view of a region 25 in FIG. 1.

Now, the configuration of the lateral end of the SOI layer 3 will be described in more detail with reference to FIG. 2. FIG. 2 is an enlarged sectional view of a region around the lateral end of the SOI layer 3 in FIG. 1. More particularly, it is an enlarged sectional view of a region 25 in FIG. 1.

Referring to FIG. 2, the lateral end of the SOI layer 3 is provided with a high concentration impurity region 13 containing a high concentration of p-type impurity. And the lateral end portion of the SOI layer 3 is rounded such that it has a predetermined curvature, as shown in FIG. 2. And the angle $\theta$ between the side surface of the SOI layer 3 and the surface of the buried oxide film 2 is an acute angle close to 90°. That is, the state is such that the thinned portion $3a$ which was a problem in the prior art has been removed. Thereby, it is made possible to effectively prevent formation of a parasitic transistor at the lateral end of the SOI layer 3.

Next, using FIGS. 3 through 8, the method of manufacturing a semiconductor device having the SOI structure shown in FIG. 8 will now be described. FIGS. 3 through 8 are sectional views stepwise showing the process of manufacturing a semiconductor device having the SOI structure shown in FIG. 1.

Figure 3:
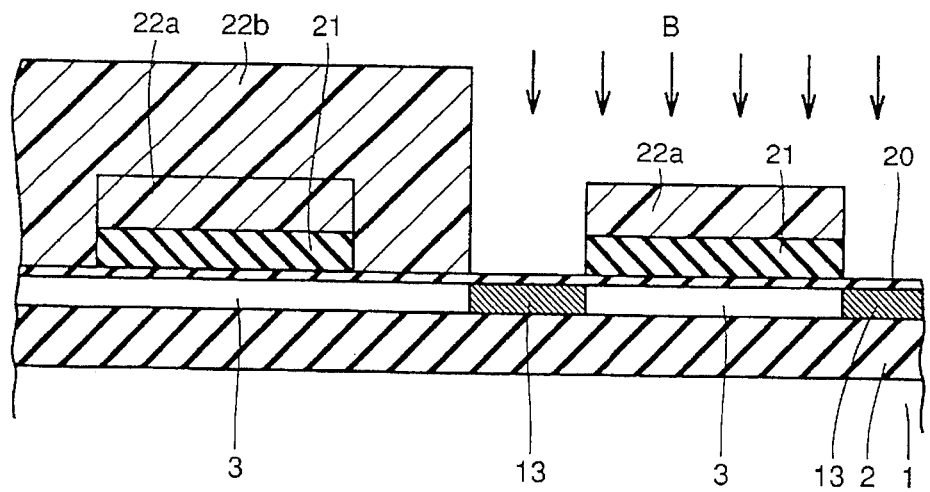
FIG. 3 is a sectional view showing the first step in the process of manufacturing a semiconductor device having the SOI structure in a first embodiment of the present invention.

First, referring to FIG. 3, after the SOI layer 3 has been formed by the same method as in the prior art, an oxide film (silicon oxide film) 20 having a thickness of about 100 Å to 300 Å is formed on the surface of the SOI layer 3. A nitride film (silicon nitride film) 21 having a thickness of about 1000 Å to 2000 Å is formed on oxide film 20 as by CVD. A resist pattern 22a is formed on nitride film 21 by the same method as in the prior art and is used as a mask to pattern the nitride film 21. And by the same method as in the prior art, a resist pattern 22b is formed, which is used as a mask to selectively implant boron (B) ions into the SOI layer 3. The implanting conditions are 5–25 KeV, $3-8 \times 10^{13}/cm^2$. Thereby, a high concentration impurity region 13 for element isolation is formed. The possession of this high concentration impurity region 13 makes it possible to increases the threshold voltage of a parasitic transistor. As a result, there is obtained an MOS transistor having an ideal subthreshold characteristics.

Figure 4A:
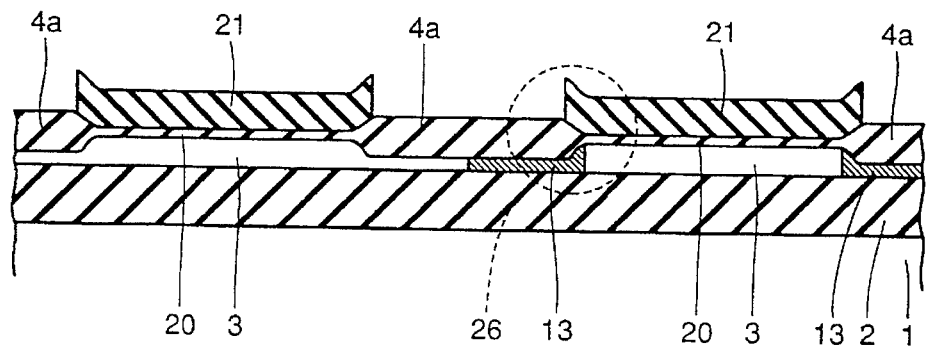
FIG. 4A is a sectional view showing the second step in the process of manufacturing a semiconductor device having the SOI structure in the first embodiment of the present invention.

Next, referring to FIG. 4A, subsequent to the removal of resist patterns 22a and 22b, a first selective oxidation treatment is applied to the SOI layer 3. The conditions are 900° C.–950° C., about 30 minutes. Thereby, an isolating oxide film 4a having a bottom surface in the SOI layer 3 is formed.

Figure 4B:
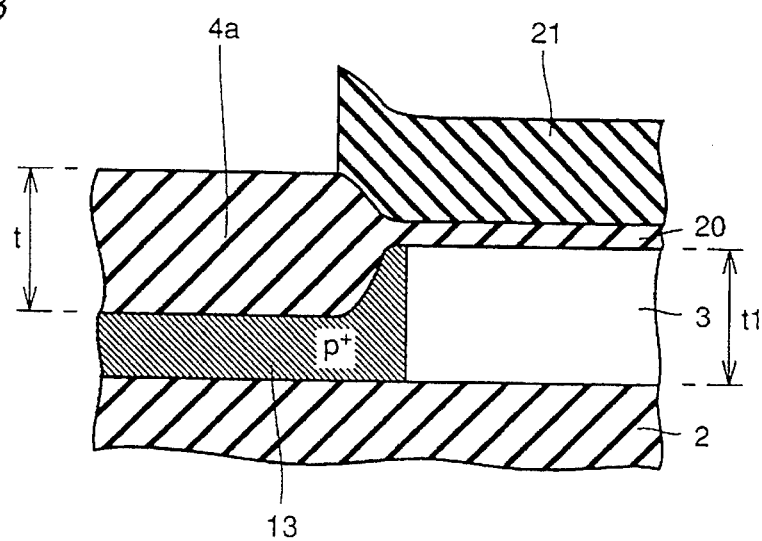
FIG. 4B is an enlarged sectional view of a region 26 in FIG. 4A.

Now, using FIG. 4B, the first selective oxidation treatment will be described in more detail. FIG. 4B is an enlarged sectional view of a region 26 in FIG. 4A.

Referring to FIG. 4B, the isolating oxide film 4a formed by the first selective oxidation treatment has a thickness t of about 1000 Å. At this time, it is preferable that the thickness t1 of the SOI layer 3 is about 1000 Å. As a result, the bottom surface of isolating oxide film 4a is located in the vicinity of the middle in the direction of the depth of the SOI layer 3. This first oxidation treatment results in rounding the upper end of the SOI layer 3 in the vicinity of the isolating oxide film 4a. Thereby, it becomes possible to suppress the field concentration in the upper end of the SOI layer 3.

Figure 5A:
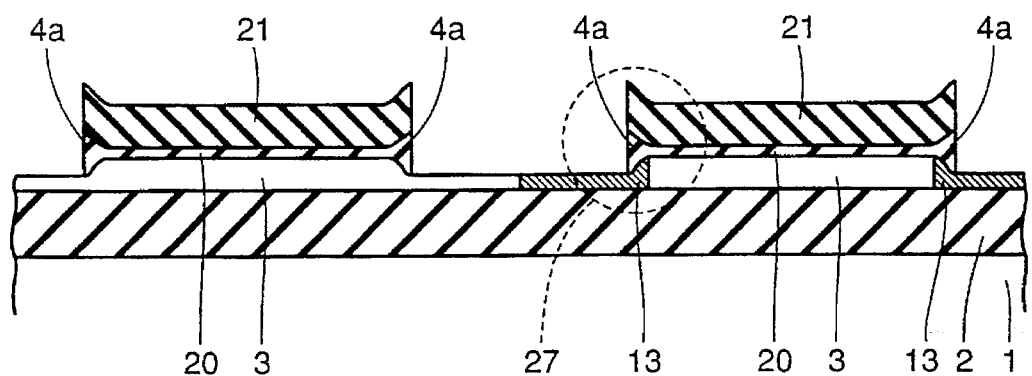
FIG. 5A is a sectional view showing the third step in the process of manufacturing a semiconductor device having the SOI structure in the first embodiment of the present invention.
Figure 5B:
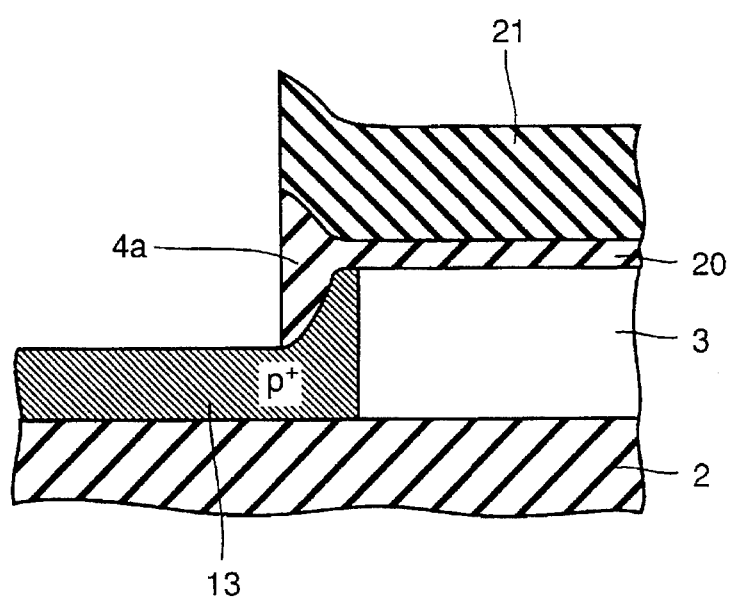
FIG. 5B is an enlarged sectional view of a region 27 in FIG. 5A.

Next, referring to FIG. 5A, using nitride film 21 as a mask, anisotropic etching is applied to the isolating oxide film 4a. Thereby, the surface of SOI layer 3 located immediately under the isolating oxide film 4a is selectively exposed. In the process, as shown in FIG. 5B, a part of the isolating oxide film 4a remains immediately under the lateral end of the nitride film 21. In addition, FIG. 5B is an enlarged sectional view of a region 27 in FIG. 5A.

Figure 6A:
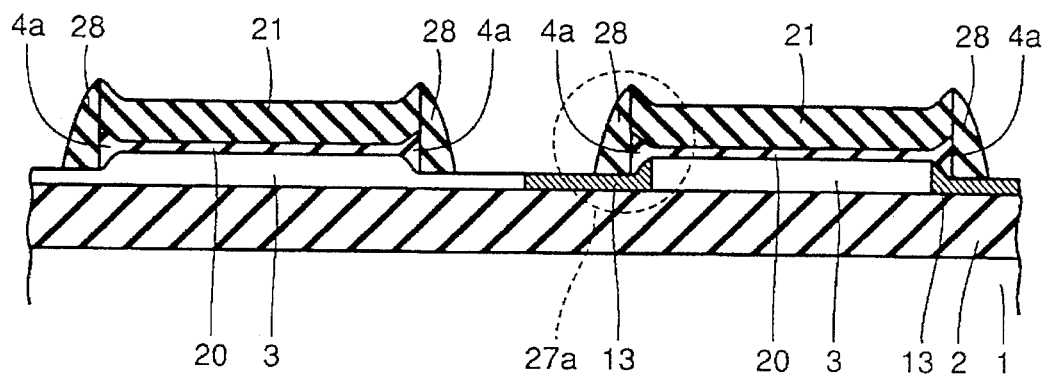
FIG. 6A is a sectional view showing the fourth step in the process of manufacturing a semiconductor device having the SOI structure in the first embodiment of the present invention.
Figure 6B:
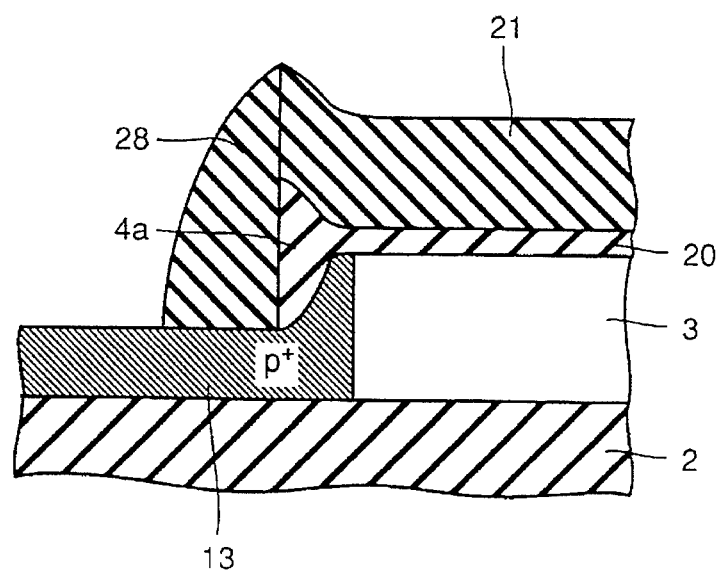
FIG. 6B is an enlarged sectional view of a region 27a in FIG. 6A.

Next, referring to FIG. 6, using the CVD process or the like, a nitride film (silicon nitride film) is formed to cover nitride film 21 and SOI layer 3. Anisotropic etching is applied to this nitride film. Thereby, a sidewall insulating layer 28 is formed on the sidewall of the nitride film 21. This sidewall insulating layer 28, as shown in FIG. 6B, is formed such that it is in contact with the surface of the SOI layer 3 and covers the isolating oxide film 4a remaining immediately under the lateral end of the nitride film 21.

Figure 7A:
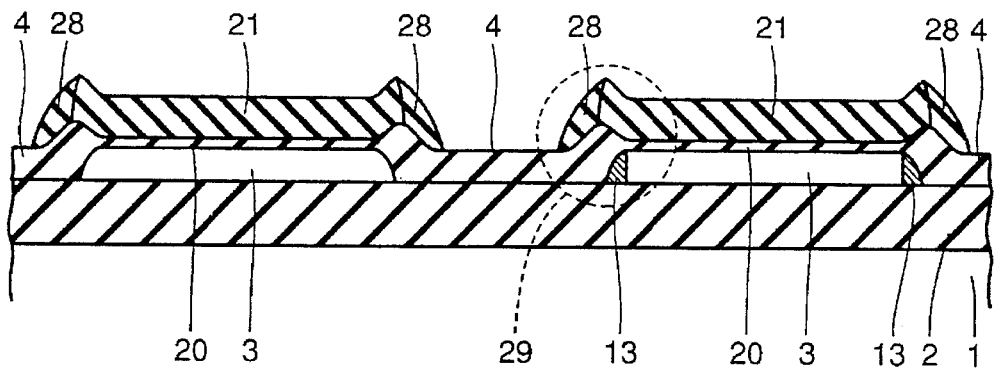
FIG. 7A is a sectional view showing the fifth step in the process of manufacturing a semiconductor device having the SOI structure in the first embodiment of the present invention.
Figure 8:
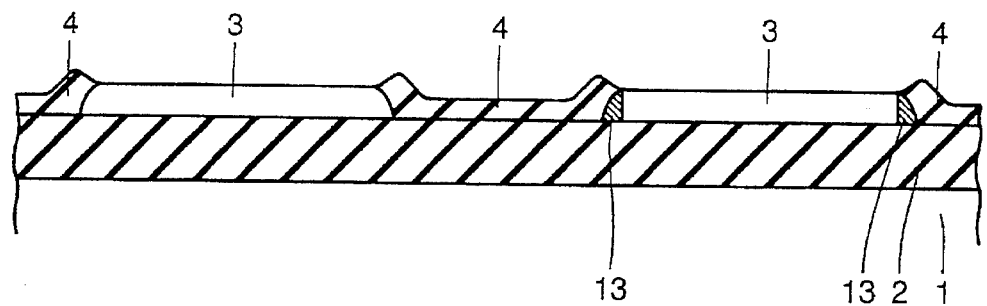
FIG. 8 is a sectional view showing the sixth step in the process of manufacturing a semiconductor device having the SOI structure in the first embodiment of the present invention.

Next, referring to FIG. 7A, using the nitride film 21 and sidewall insulating layer 28 as masks, a second selective oxidation treatment is performed. The conditions are 900° C.–950° C., about 40 minutes–50 minutes. Thereby, there is formed an isolating oxide film 4 which reaching the buried oxide film 2 and which is integrated with the isolating oxide film 4a. And at this time, the lateral end of the SOI layer 3 adjacent the isolating oxide film 4 is rounded, a thinned portion 3a is not formed.

Figure 7B:
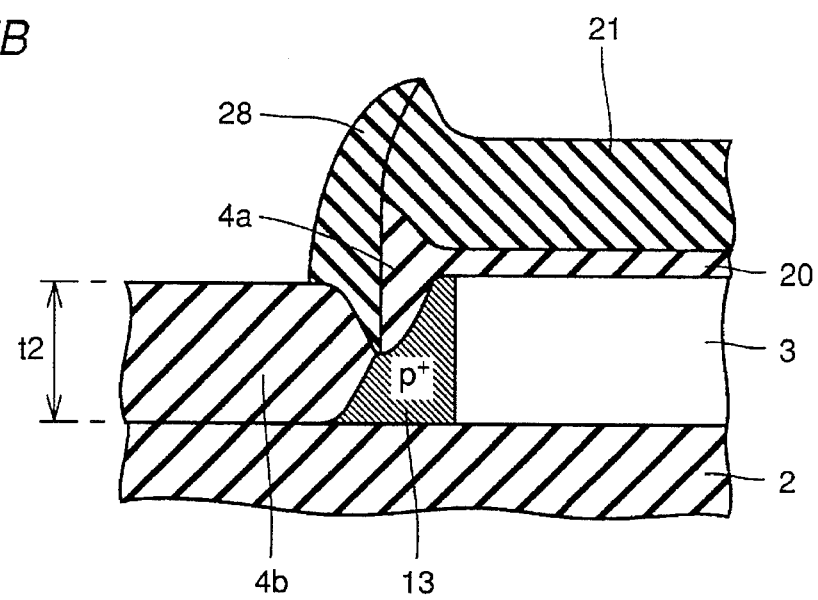
FIG. 7B is an enlarged sectional view of a region around the end of the SOI layer at a certain stage in the second selective oxidation treatment.
Figure 7C:
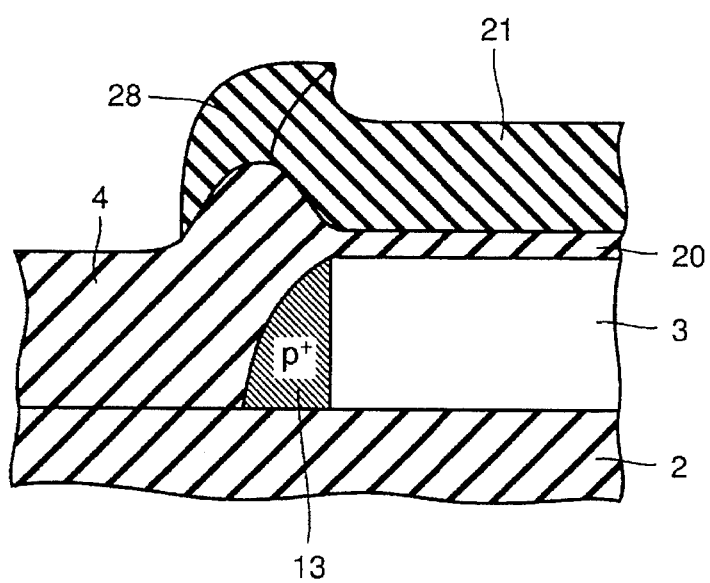
FIG. 7C is an enlarged sectional view of a region 29 in FIG. 7A.

Now, using FIGS. 7B and 7C, the second selective oxidation treatment will be described in more detail. FIGS. 7B and 7C are enlarged sectional views of a region 29 in FIG. 7A.

Referring to FIG. 7B, first, the isolating oxide film 4b is formed by the second selective oxidation treatment such that the isolating oxide film 4b reaches the buried oxide film 2. The thickness t2 of this isolating oxide film 4b is about 1000 Å. At this step, a somewhat thinned portion, though not so thin as in the prior art, is formed in the bottom of the SOI layer 3 located close to the isolating oxide film 4b.

Then, the bottom of SOI layer 3 close to the isolating oxide film 4b is oxidized further in the state shown in FIG. 7B. Thereby, as shown in FIG. 7C, the bottom of the SOI layer 3 close to the isolating oxide film 4b is rounded. That is, in the second selective oxidation treatment, a relatively more excessive (longer time) oxidation treatment than in the first selective oxidation treatment is performed, thereby preventing a thinned portion from being formed in the lateral end of the SOI layer 3. Such excessive oxidation is made possible mainly by the presence of the sidewall insulating layer 28. In other words, the formation of the sidewall insulating layer 28 makes it possible to suppress the growth of a bird's beak in the isolating oxide film 4 during the second selective oxidation treatment. Thereby, the excessive oxidation treatment as described above becomes possible. Further, the presence of the sidewall insulating layer 28 ensures that the oxidizing agent is fed predominantly to the bottom of the SOI layer 3 close to the isolating oxide film 4b. As a result, a thinned portion which is extremely thin can be effectively prevented from being formed in the bottom of the SOI layer 3 located close to the isolating oxide film 4, so that it becomes possible to form an MOS transistor having ideal characteristics on the SOI layer 3.

Thereafter, as shown in FIG. 8, the nitride film 21 and sidewall insulating layer 28 are removed as by hot phosphoric acid and the oxide film 20 on the surface of the SOI layer 3 is removed by wet etching. Thereafter, again, an oxide film 20 is formed on the surface of the SOI layer 3 by using thermal oxidation or the like. Thereafter, through the same process as in the prior art, the semiconductor device shown in FIG. 1 is obtained.

(Second Embodiment)

Next, using FIGS. 9 through 12, a second embodiment of the present invention will be described. FIGS. 9 through 12 are sectional views showing the first through fourth characteristic steps of the process of manufacturing a semiconductor device having an SOI structure according to the second embodiment of the invention.

Figure 9:
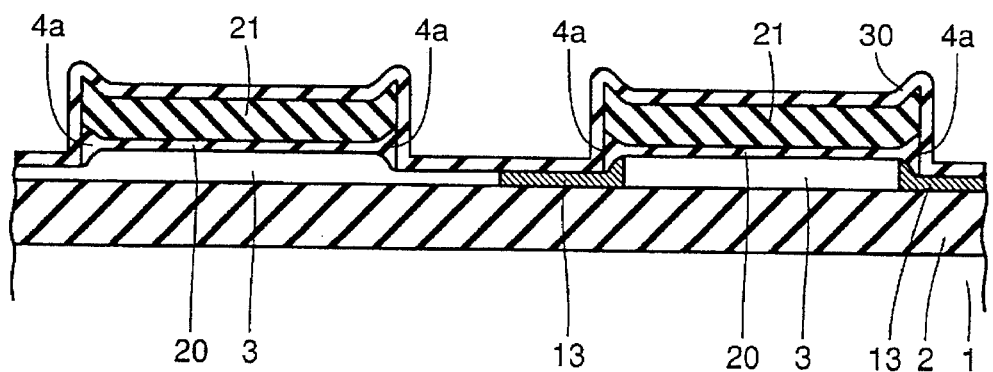
FIGS. 9 through 12 are sectional views showing the first through fourth characteristic steps of the process of manufacturing a semiconductor device having the SOI structure according to a second embodiment of the invention.

First, referring to FIG. 9, through the same process as in the first embodiment, the isolating oxide film 4a is allowed to remain immediately under the lateral end of the nitride film 21. Thereafter, an oxide film (silicon oxide film) 30 having a thickness of about 100 Å–200 Å is formed by using the CVD process.

Figure 10:
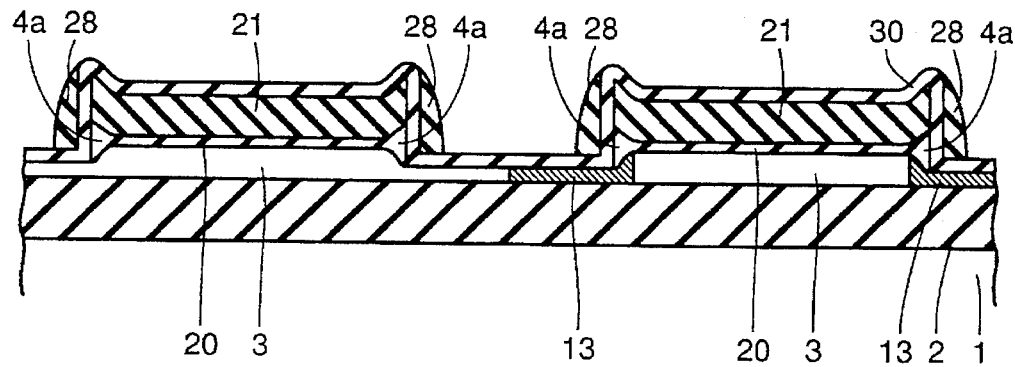
Figure 11:
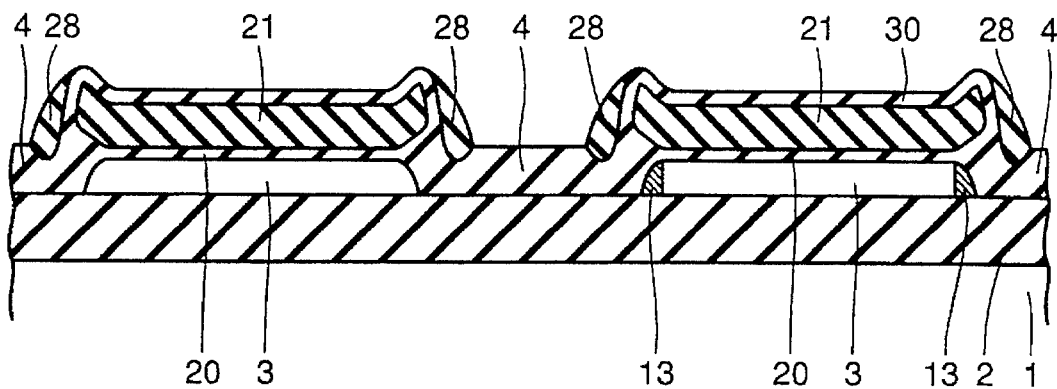

Next, referring to FIG. 10, a sidewall insulating layer 28 is formed on the sidewall of the nitride film 21 with an oxide film 30 therebetween by the same method as in the first embodiment. And the second selective oxidation treatment is performed by the same method as in the first embodiment. Thereby, an isolating oxide film 4 is formed, as shown in FIG. 11.

In the first embodiment described above, it may be feared that the direct contact between the sidewall insulating layer 28 formed of a nitride film or the like and the SOI layer 3 leads to the occurrence of the defects in the crystal lattice of SOI layer 3. However, as in this embodiment, the interposition of the oxide film 30 between the sidewall insulating layer 28 and the SOI layer 3 makes it possible to prevent the occurrence of the defects in the crystal lattice of SOI layer 3. In addition, since the oxide film 30 is as thin as 100 Å–200

Å, as described above, the bird's beak of the isolating oxide film 4 is not so long.

Figure 12:
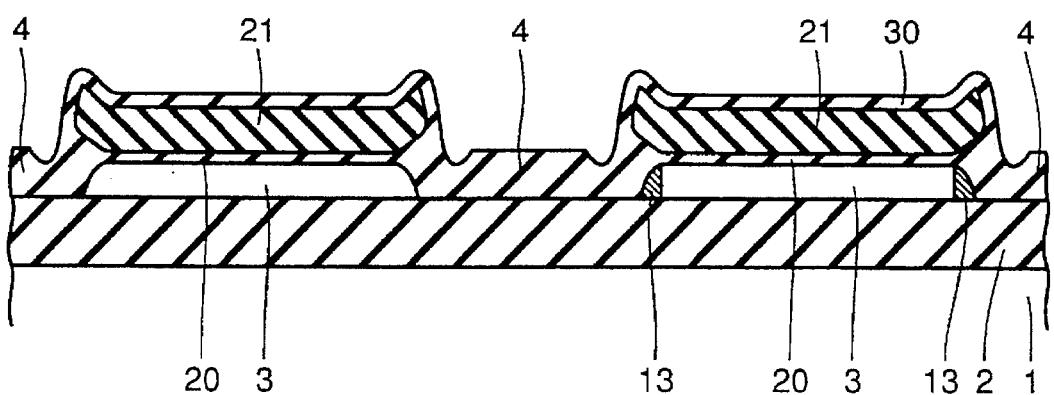

Next, as shown in FIG. 12, the sidewall insulating layer 28 is removed as by hot phosphoric acid. Thereafter, the silicon oxide film 30 is removed by wet etching, then nitride film 21 is removed by the use of hot phosphoric acid. Thereafter, through the same process as in the first embodiment, a semiconductor device which is substantially the same as that shown in FIG. 1 is obtained.

(Third Embodiment)

Figure 13:
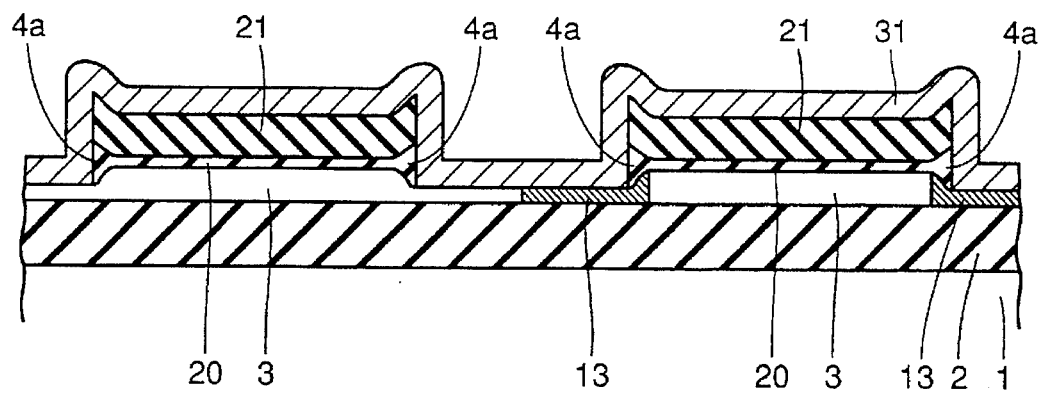
FIGS. 13 through 15 are sectional views showing the first through third characteristic steps of the process of manufacturing a semiconductor device having the SOI structure according to a third embodiment of the invention.
Figure 14:
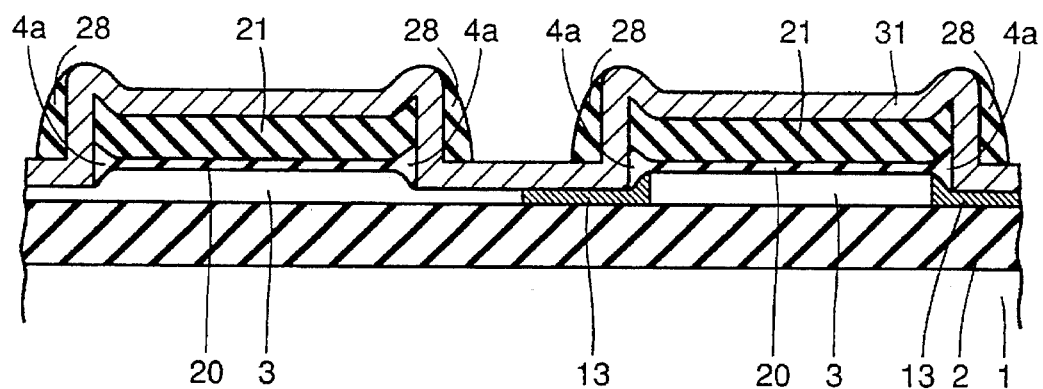
Figure 15:
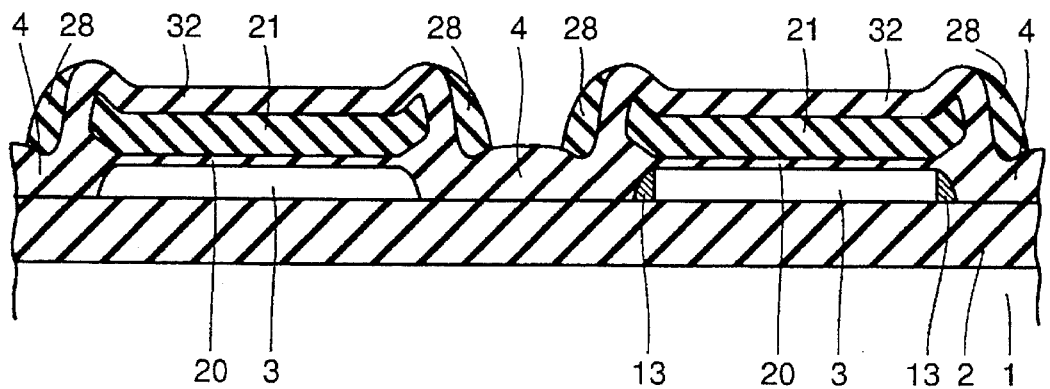

Next, using FIGS. 13 through 15, a third embodiment of the present invention will be described. FIGS. 13 through 15 are sectional views showing the first through third characteristic steps of the process of manufacturing a semiconductor device having an SOI structure according to the third embodiment of the invention.

First, referring to FIG. 13, through the same process as in the first embodiment, the isolating oxide film 4a is allowed to remain immediately under the lateral end of the nitride film 21. Thereafter, using the CVD process or the like, a polycrystalline silicon layer 31 having a thickness of about 20 Å–500 Å is deposited on the nitride film 21 and SOI layer 3 to cover the same. The thickness of this polycrystalline silicon layer 31 is preferably as small as possible and most preferably about 20 Å–100 Å.

Next, referring to FIG. 14, a sidewall insulating layer 28 is formed through the same process as in the first embodiment. And the second selective oxidation treatment is applied by the same method as in the first embodiment. this second selective oxidation treatment is performed preferably at about 850° C. to 950° C. Thereby, an isolating oxide film 4 is also formed, as shown in FIG. 15.

Thus, the interposition of the polycrystalline silicon layer 31 between the sidewall insulating layer 28 and the SOI layer 3 during the second selective oxidation treatment makes it possible, as in the second embodiment described above, to effectively prevent the occurrence of the defects in the crystal lattice of SOI layer 3. Further, the formation of the polycrystalline silicon layer 31 in this manner ensures that the oxidizing agent does not reach the buried oxide film 2 during the time the polycrystalline silicon layer 31 is oxidized. Thereby, it becomes possible to effectively prevent the bottom surface of the SOI layer 3 being inadvertently oxidized. Thereafter, through the same process as in the second embodiment, substantially the same semiconductor device as that shown in FIG. 1 is obtained.

(Fourth Embodiment)

Figure 16:
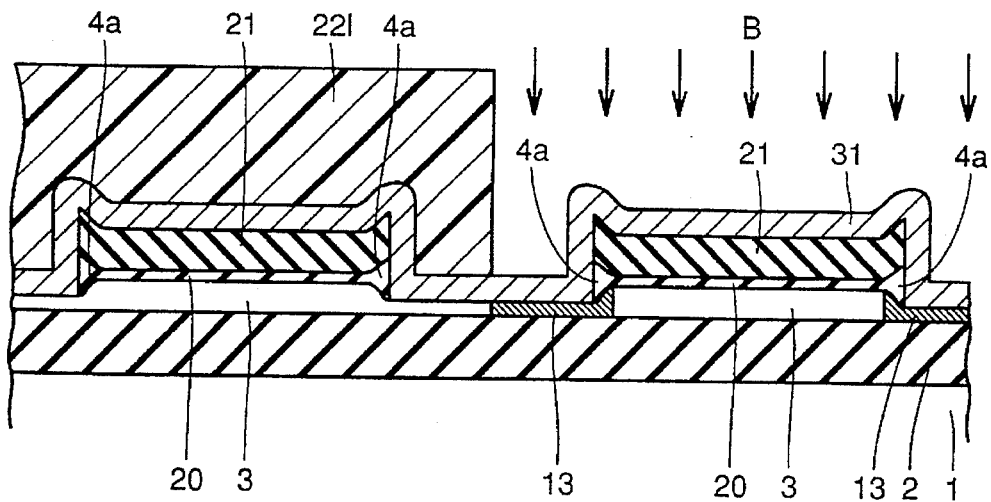
FIGS. 16 through 18 are sectional views showing the first through third characteristic steps of the process of manufacturing a semiconductor device having the SOI structure according to a fourth embodiment of the invention.
Figure 17:
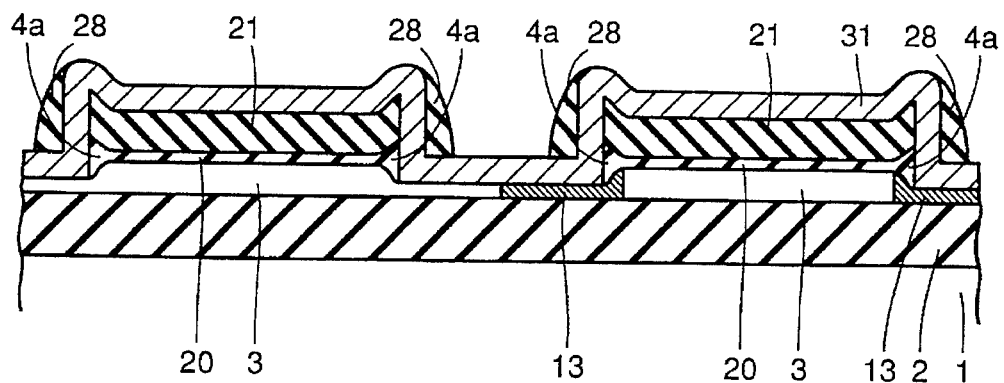
Figure 18:
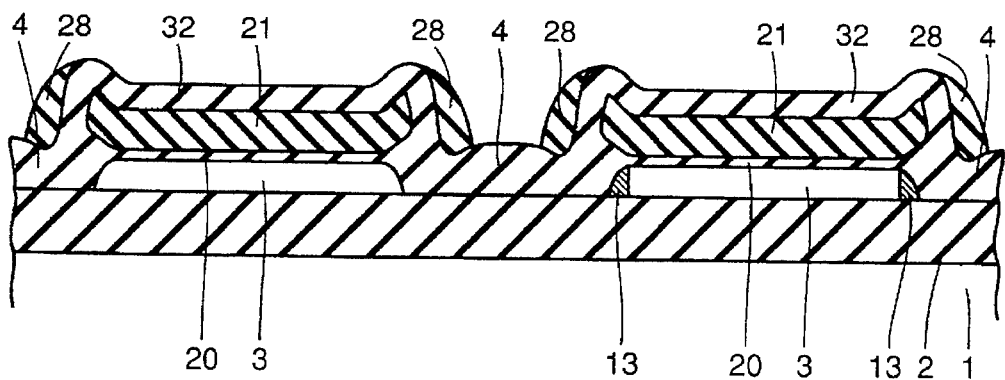

Next, using FIGS. 16 through 18, a fourth embodiment of the present invention will be described. FIGS. 16 through 18 are sectional views showing the first through third characteristic steps of the process of manufacturing a semiconductor device having an SOI structure according to the fourth embodiment of the invention.

First, referring to FIG. 16, through the same process as in the first embodiment, the isolating oxide film 4a is allowed to remain immediately under the lateral end of the nitride film 21. Then, a polycrystalline silicon layer 31 is formed by the same method as in the third embodiment. And a resist pattern 221 is formed to cover the region where a pMOS transistor 15 is to be formed, and boron (B) is implanted into the polycrystalline silicon layer 31 using this resist pattern 221 as a mask. The conditions are 5–10 KeV, $3-8 \times 10^{14}/cm^2$. Thereafter, the resist pattern 221 is removed.

Next, referring to FIG. 17, a sidewall insulating layer 28 is formed by the same method as in the first embodiment. And in this state, the second selective oxidation treatment is applied under the same conditions as in the first embodiment. Thereby, an isolating oxide film 4 is formed, as shown in FIG. 18.

As described above, the implantation of an impurity, such as boron (B), into the polycrystalline silicon layer 31 makes it possible to allow the boron (B) implanted into the polycrystalline silicon layer 31 to diffuse into the SOI layer 3 during the second selective oxidation treatment. Thereby, it becomes possible to effectively prevent the lowering of the concentration of the p-type impurity contained in the high concentration impurity region 13 formed in the lateral end of the SOI layer 3. Thereby, it becomes possible to more effectively suppress the formation of a parasitic transistor in the lateral end of the SOI layer 3.

(Fifth Embodiment)

Figure 19:
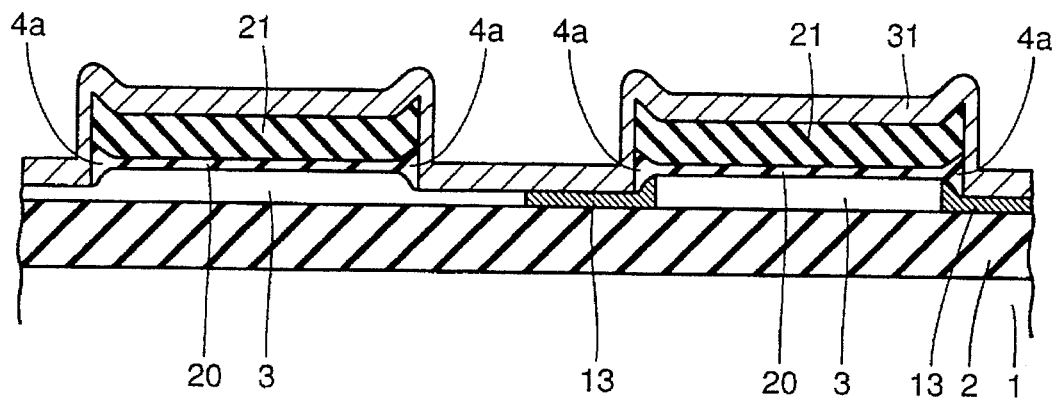
FIGS. 19 through 21 are sectional views showing the first through fourth characteristic steps of the process of manufacturing a semiconductor device having the SOI structure according to a fifth embodiment of the invention.
Figure 20:
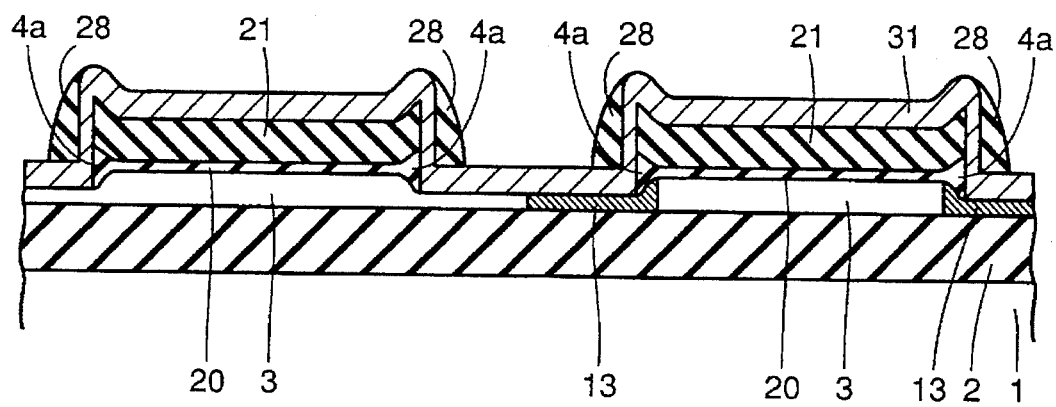
Figure 21:
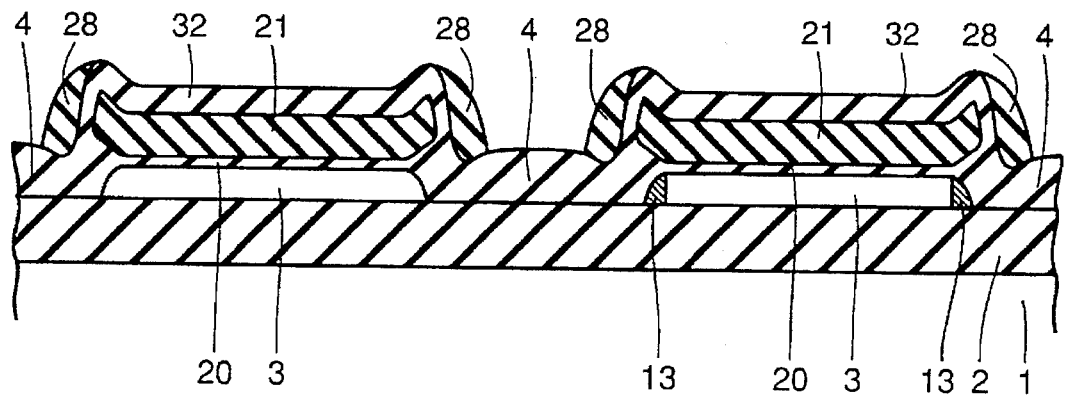

Next, using FIGS. 19 through 21, a fifth embodiment of the present invention will be described. FIGS. 19 through 21 are sectional views showing the first through third characteristic steps of the process of manufacturing a semiconductor device having an SOI structure according to the fifth embodiment of the invention.

First, referring to FIG. 19, using the same method as in the first embodiment, the isolating oxide film 4a is allowed to remain immediately under the lateral end of the nitride film 21. Thereafter, a polycrystalline silicon layer 31 is formed as by the collimation sputtering method or the like which is highly oriented to anisotropy. Thereby, the thickness of the portion of polycrystalline silicon layer 31 formed on the upper surface of the nitride film 21 becomes greater than that of the portion formed on the side surface of the nitride film 21. More particularly, the thickness of the polycrystalline silicon layer 31 formed on the upper surface of the nitride film 21 can be made about 10 times as great as that of the polycrystalline silicon layer 31 formed on the side surface of the nitride film 21. As a result, the thickness of the polycrystalline silicon layer 31 covered with the sidewall insulating layer 28 is decreased. Thereby, it becomes possible to reduce the time required for the second selective oxidation treatment. Thereby, it becomes possible to reduce the bird's beak length of the isolating oxide film 4.

Thereafter, through the same process as in the third embodiment, substantially the same semiconductor device as that shown in FIG. 1 is obtained.

(Sixth Embodiment)

Figure 22:
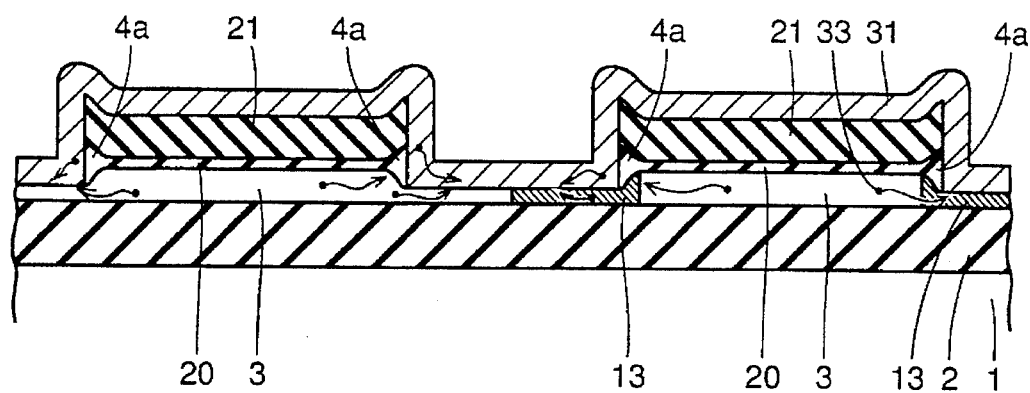
FIGS. 22 and 23 are sectional views showing the first and second characteristic steps of the process of manufacturing a semiconductor device having the SOI structure according to a sixth embodiment of the invention.
Figure 23:
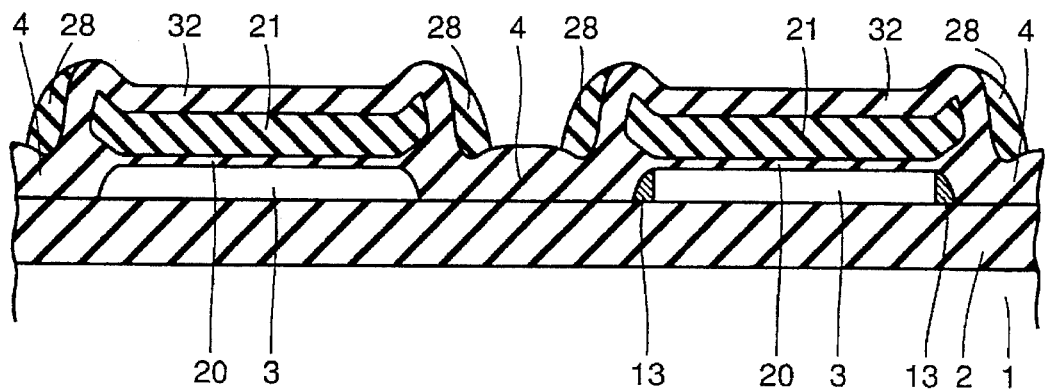

Next, using FIGS. 22 and 23, a sixth embodiment of the present invention will be described. FIGS. 22 and 23 are sectional views showing the first and second characteristic steps of the process of manufacturing a semiconductor device having an SOI structure according to the sixth embodiment of the invention.

First, referring to FIG. 22, after a polycrystalline silicon layer 31 has been formed by the same method as in the third or fifth embodiment, heat treatment at about 850° C. in a nitrogen or hydrogen ambience for about 30 minutes –60 minutes is applied to polycrystalline silicon layer 31. Thereby, both the gettering of the heavy metal (metallic impurity) 33 which forms a cause of contamination and the recovery of damage to the SOI layer 3 due to the anisotropic etching of the isolating oxide film 4a are effected. When anisotropic etching is applied to the isolating oxide film 4a, it is feared that the surface of the SOI layer 3 is contaminated by the heavy metal 33. It is also feared that the damage due to plasma remains on the surface of the SOI layer 3. In this case, the application of above heat treatment makes it possible to effect both the gettering of the heavy metal 33 and the recovery of damage to the SOI layer 3.

Next, referring to FIG. 23, a sidewall insulating layer 28 is formed by the same method as in the first embodiment, and then the second selective oxidation treatment is performed by the same method as in the first embodiment.

Thereby, an isolating oxide film 4 is formed. In addition, said heat treatment may be performed subsequent to the formation of the sidewall insulating layer 28. Thereafter, through the same process as in the third embodiment, substantially the same semiconductor device as that shown in FIG. 1 is obtained.

(Seventh Embodiment)

Figure 24:
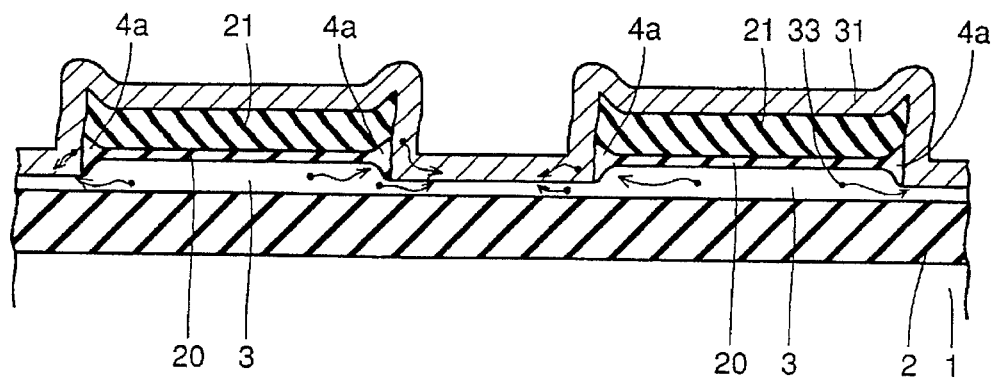
FIGS. 24 through 26 are sectional views showing the first through third characteristic steps of the process of manufacturing a semiconductor device having the SOI structure according to a seventh embodiment of the invention.
Figure 25:
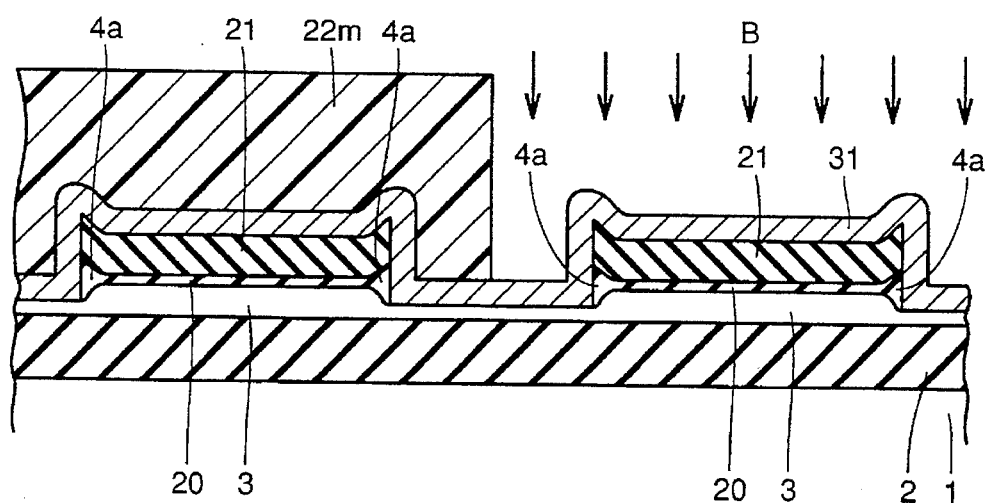
Figure 26:
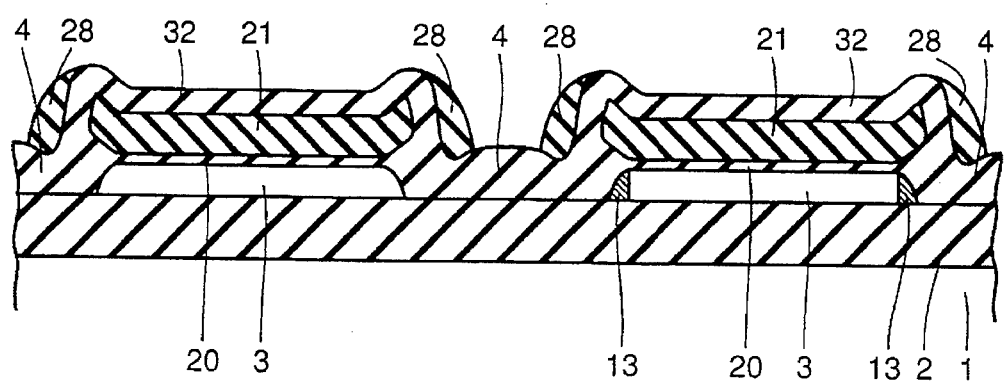

Next, using FIGS. 24 through 26, a seventh embodiment of the present invention will be described. FIGS. 24 through 26 are sectional views showing the first through third characteristic steps of the process of manufacturing a semiconductor device having an SOI structure according to the seventh embodiment of the invention.

First, referring to FIG. 24, the nitride film 21 is patterned by the same method as in the prior art. Thereafter, the first Selective oxidation treatment is performed without implanting a p-type impurity such as boron (B) into the SOI layer 3. And using the same method as in the first embodiment, the isolating oxide film 4a is allowed to remain only immediately under the lateral end of the nitride film 21. Thereafter, a polycrystalline silicon layer 31 is formed by the same method as in the third or fifth embodiment. Thereafter, a heat treatment at a high temperature of about 1000° C.–1100° C. for about 30 minutes–60 minutes is applied to the polycrystalline silicon layer 31 in a nitrogen or hydrogen ambience. Thereby, it becomes possible to effect both the recovery of damage to the SOI layer 3 and the gettering of the heavy metal 33 much more effectively than in the sixth embodiment.

Next, referring to FIG. 25, a resist pattern 22m is formed to cover the region where the pMOS transistor 15 is to be formed. Using this resist pattern 22m as a mask, boron (B) is implanted into the polycrystalline silicon layer 31. The conditions are 20 KeV, $3\times10^{13}/cm^2$–$3\times10^{14}/cm^2$. Thereafter, the resist pattern 22m is removed.

Next, referring to FIG. 26, a sidewall insulating layer 28 is formed by the same method as in the first embodiment. Thereafter, the second selective oxidation treatment is performed by the same method as in the first embodiment. Thereby, an isolating oxide film 4 is formed. Thereafter, through the same process as in the third embodiment, substantially the same semiconductor device as that shown in FIG. 1 is obtained.

In addition, in the sixth and seventh embodiments, prior to the heat treatment intended for gettering, silicon ions may be implanted into the polycrystalline silicon layer 31 at the rate of about $3\times10^{14}/cm^2$–$9\times10^{16}/cm^2$. Thereby, it becomes possible to change the polycrystalline silicon layer 31 into amorphous silicon layer. The amorphous silicon layer thus formed contains a greater number of dangling bonds and hence provides an increased number of gettering sites. As a result, it becomes possible to allow the heavy metal to aggregate efficiently. In addition, ions to be implanted into the polycrystalline silicon layer 31 may be such ions being inactive with respect to silicon as N, F or C.

Further, in the third through seventh embodiments, the polycrystalline silicon layer 31 may be replaced by an amorphous silicon layer. Further, the characteristic arrangements in the first through seventh embodiments may be combined.

As has been described so far, according to this invention, when an isolating oxide film for isolating elements from each other is formed, it is possible to effectively prevent a thinned portion from being formed in the bottom of the SOI layer close to the isolating oxide film. Thereby, it becomes possible to effectively prevent a parasitic transistor from being formed in the lateral end of the semiconductor layer.

As a result, a semiconductor device having an SOI structure with high reliability can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having an SOI structure comprising the steps of;

forming a semiconductor layer on a main surface of a substrate with an insulating layer interposed, forming on said semiconductor layer an oxidation-resistant film which is patterned, applying a first selective oxidation treatment to said semiconductor layer using said oxidation-resistant film as a mask to form a first isolating oxide film having a bottom surface in said semiconductor layer, applying anisotropic etching to said first isolating oxide film using said oxidation-resistant film as a mask to expose selectively the surface of said semiconductor layer and to leave a part of said first isolating oxide film under the lateral end of said oxidation-resistant film, forming a sidewall insulating layer of oxidation-resistant material over the sidewall of said oxidation-resistant film to cover said first isolating oxide film being left under said oxidation-resistant film, and applying a second selective oxidation treatment to the exposed surface of said semiconductor layer using said oxidation-resistant film and said sidewall insulating layer as masks to form a second isolating oxide film integrated with said first isolating oxide film and reaching said insulating layer.

2. A method of manufacturing a semiconductor device having an SOI structure according to claim 1, wherein the step of applying said first selective oxidation treatment includes the step of converting the upper half of said semiconductor layer into said first isolating oxide film, and the step of applying said second selective oxidation treatment includes the step of oxidizing the bottom of said semiconductor layer adjacent to said second isolating oxide film subsequent to the formation of said second isolating oxide film reaching said insulating layer.

3. A method of manufacturing a semiconductor device having an SOI structure according to claim 2, wherein the period of said second selective oxidation treatment is longer than that of said first selective oxidation treatment.

4. A method of manufacturing a semiconductor device having an SOI structure according to claim 1, wherein the step of forming said sidewall insulating layer includes the step of forming an oxide film to cover said oxidation-resistant film and the exposed surface of said semiconductor layer, and the step of forming a sidewall insulating layer on said oxide film.

5. A method of manufacturing a semiconductor device having an SOI structure according to claim 1, wherein the step of forming a sidewall insulating layer includes the step of forming a polycrystalline silicon layer to cover said oxidation-resistant film and the exposed surface of the semiconductor layer, and the step of forming said sidewall insulating layer on said polycrystalline silicon layer.

6. A method of manufacturing a semiconductor device having an SOI structure according to claim 5, wherein the step of forming said oxidation-resistant film further includes the step of forming a high concentration impurity region for element isolation in said semiconductor layer by selectively implanting an impurity into said semiconductor layer using said oxidation-resistant film as a mask, the step of forming a polycrystalline silicon layer further includes the step of implanting an impurity having the same conductivity type as that contained in said high concentration impurity region into said polycrystalline silicon layer.

7. A method of manufacturing a semiconductor device having an SOI structure according to claim 5, wherein the step of forming said polycrystalline silicon layer includes the step of forming said polycrystalline silicon layer in such a manner that the thickness of said polycrystalline silicon layer formed on the side surface of said oxidation-resistant layer is less than the thickness of said polycrystalline silicon layer formed on the upper surface of said oxidation-resistant film.

8. A method of manufacturing a semiconductor device having an SOI structure according to claim 5, wherein the step of forming a polycrystalline silicon layer further includes the step of performing gettering by applying a heat treatment to said polycrystalline silicon layer in an ambience of at least one member selected from the group consisting of hydrogen and nitrogen.

9. A method of manufacturing a semiconductor device having an SOI structure according to claim 8, wherein the step of forming said polycrystalline silicon layer further includes the step of implanting an impurity into said polycrystalline silicon layer subsequent to said heat treatment, the step of applying said second selective oxidation treatment further includes the step of forming a high concentration impurity region for element isolation in the resulting exposed lateral end of said semiconductor layer by diffusing said impurity in said semiconductor layer.

10. A method of manufacturing a semiconductor device having an SOI structure according to claim 8, wherein the step of forming a polycrystalline silicon layer further includes the step of converting said polycrystalline silicon layer into amorphous silicon layer by implanting ions inactive with respect to silicon into said polycrystalline silicon layer.

11. A method of manufacturing a semiconductor device having an SOI structure according to claim 1, wherein the step of forming an oxidation-resistant film further includes the step of forming a high concentration impurity region for element isolation in said semiconductor layer by selectively implanting an impurity into said semiconductor layer using said oxidation-resistant film as a mask.

12. A method of manufacturing a semiconductor device having an SOI structure according to claim 1, wherein the step of forming a sidewall insulating layer further includes the step of forming an amorphous silicon layer to cover said oxidation-resistant film and the exposed surface of said semiconductor layer, and the step of forming said sidewall insulating layer on said amorphous silicon layer.

* * * * *